(12) United States Patent
Aoki et al.

(10) Patent No.: US 6,614,504 B2
(45) Date of Patent: Sep. 2, 2003

(54) EXPOSURE APPARATUS, EXPOSURE METHOD, AND DEVICE MANUFACTURING METHOD

(75) Inventors: Takashi Aoki, Kawasaki (JP); Soichi Owa, Setagaya-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/819,631

(22) Filed: Mar. 29, 2001

(65) Prior Publication Data

US 2001/0026355 A1 Oct. 4, 2001

(30) Foreign Application Priority Data

Mar. 30, 2000 (JP) .................................. 2000-095638
Dec. 28, 2000 (JP) .................................. 2000-400060

(51) Int. Cl.[7] .......................... G03B 27/52; G03B 27/42
(52) U.S. Cl. ............................ 355/30; 355/53; 430/5
(58) Field of Search ............................ 355/30, 52, 53, 355/77, 75; 359/507, 512; 250/492.2, 492.22; 430/5

(56) References Cited

U.S. PATENT DOCUMENTS

| 4,699,505 A | * 10/1987 | Komoriya et al. ............ 355/30 |
| 4,786,947 A | * 11/1988 | Kosugi et al. ................ 355/30 |
| 4,966,457 A | * 10/1990 | Hayano et al. |
| 5,559,584 A | 9/1996 | Miyaji et al. |
| 5,696,623 A | * 12/1997 | Fujie et al. ................ 359/350 |
| 5,812,242 A | * 9/1998 | Tokuda ........................ 355/30 |
| 5,814,156 A | * 9/1998 | Elliott et al. |
| 5,814,381 A | * 9/1998 | Kuo ............................ 428/14 |
| 5,883,704 A | * 3/1999 | Nishi et al. |

FOREIGN PATENT DOCUMENTS

| JP | A-9-73167 | 3/1997 |
| JP | A-9-197652 | 7/1997 |
| JP | A-2000-19721 | 1/2000 |
| WO | WO 00/55891 | 9/2000 |

OTHER PUBLICATIONS

U.S. patent application Ser. No. 09/731,669, Sato, filed Dec. 8, 2000.

* cited by examiner

Primary Examiner—Alan A. Mathews
(74) Attorney, Agent, or Firm—Oliff & Berridge, PLC

(57) ABSTRACT

An exposure apparatus of the present invention provides a mask having a first space formed by a protection member, which protects a pattern formation area on a mask substrate, and a frame, which supports the protection member, inside a second space, and transfers the pattern of the mask provided in the second space onto a substrate by using an energy beam from a light source. The apparatus has a gas replacement chamber which replaces gas in the first space with a predetermined gas, which the energy beam passes through, while maintaining a predetermined pressure in the first space.

18 Claims, 11 Drawing Sheets

EXPOSURE APPARATUS, EXPOSURE METHOD, AND DEVICE MANUFACTURING METHOD

BACKGROUND OF THE INVENTION

1. Field of the Invention

The present invention relates to an exposure apparatus, an exposure method, and a device manufacturing method for manufacturing electronic devices such as semiconductor devices, liquid crystal displays, image-capturing devices (such as a CCD), thin-film magnetic heads or the like.

2. Description of the Related Art

Projection exposure apparatuses are used in manufacturing electronic devices such as semiconductor devices and liquid crystal displays by using photolithography. This type of projection exposure apparatus projects the image of a pattern formed on a mask or reticle (hereinafter called "reticle") on projection (shot) areas on a substrate whose surface is coated with a photosensitive agent (resist) via a projection optical system. The circuit of the electronic device is formed by transferring circuit pattern on the substrate by using the projection exposure apparatus, and by post-processing. An integrated circuit comprises, for example, approximately twenty layers of such circuit interconnections provided repeatedly.

Due to recent high-intensity integration of integrated circuits (i.e. miniaturization of circuit patterns), the wavelengths of illumination light for exposure (hereinafter called "exposure light") in the projection exposure apparatus are becoming shorter. In other words, exposure apparatuses that use a KrF excimer laser (wavelength: 248 nm) and an ArF excimer laser (193 nm) are nearing the final stage of practical use. In the quest for even higher-intensity integration, research is being made into an $F_2$ laser (157 nm) and an $Ar_2$ laser (126 nm).

Light (energy beam) having a wavelength of approximately 120 nm to 200 nm belongs in the vacuum ultraviolet region, and such light (hereinafter called "vacuum ultraviolet rays") does not pass through air. This is due to the act that substances such as oxygen molecules, water molecules, and carbon dioxide molecules (hereinafter called "light-absorptive substance") in the air absorb the energy of the light.

For this reason, when the vacuum ultraviolet rays are used as the exposure light, the light-absorptive substance in the space on the path of the exposure light must be reduced in order to enable the exposure light to attain a sufficient level of illumination on the substrate. Therefore, in conventional exposure apparatuses, the light-absorptive substance in the light path space is reduced by maintaining the space in a state of reduced pressure, and replacing the gas in the space with a supply of a gas (low absorptive gas) which has low absorption of energy of exposure light after reducing the pressure of the space.

For instance, in an exposure apparatus using the $F_2$ laser, the entire space on the path of the exposure light beam must be purged with a high-purity inert gas. In this case, when the total light wavelength is for example 1000 nm, the density of the light-absorptive substance on the optical path should for practical purposes be less than approximately 1 ppm.

However, a reticle generally has a protection member called a pellicle in order to prevent unwanted substances from adhering to the pattern formation areas, and the pellicle is usually fixed to the reticle via a frame (metal frame). Consequently, when the vacuum ultraviolet rays are used as the exposure light as described above, it is also necessary to reduce a light-absorptive substance in the space (space inside pellicle) created by the pellicle and the metal frame.

The frame usually comprises an opening (ventilation hole) for preventing the pellicle from breaking when the atmospheric pressure changes. The opening prevents the pellicle being broken without creating any difference between the pressure in the space in the pellicle and the atmospheric pressure, even when the atmospheric pressure changes as a result of, for example, transportation by aircraft, a change in weather or the like.

The pellicle is an extremely thin transparent film having a thickness of approximately several hundred nanometers to several micrometers, and has an organic compound such as nitrocellulose as its essential component. Therefore, in the aforementioned method for reducing pressure in the space, there is a danger that the pellicle will deform and break as a result of changes in the pressure in the space, making it difficult to stably reduce the light-absorptive substance.

SUMMARY OF THE INVENTION

The present invention has been achieved in order to solve the above problems. It is an object of the present invention to provide an exposure method and apparatus, and a device manufacturing method, which can stably and efficiently reduce a light-absorptive substance from the space formed by a pellicle in a reticle, and increase the precision of the exposure light.

In order to achieve the above objects, a first aspect of the present invention provides an exposure apparatus comprising a mask having a first space formed by a protection member, which protects a pattern formation area on a mask substrate, and a frame, which supports the protection member, inside a second space, the pattern of the mask provided in the second space being transferred onto a substrate by using an energy beam from a light source. The exposure apparatus has a gas replacement chamber which replaces gas in the first space with a predetermined gas, which the energy beam passes through, while maintaining a predetermined pressure in the first space.

In this exposure apparatus, the gas replacement chamber replaces the gas in the first space, formed by the protection member and the frame, with the predetermined gas while maintaining a predetermined pressure in the first space. Deforming of the protection member due to pressure change is thereby reduced, and breakage of the protection member is prevented. Therefore, the light-absorptive substance is stably reduced from the first space.

In this case, a gas supply device which supplies the predetermined gas to the gas replacement chamber may be provided, and the frame may have a supply opening, which supplies the predetermined gas in the gas replacement chamber to the space, and an exhaust opening, which exhausts the gas in the space into the gas replacement chamber. The gas supply device supplies the predetermined gas to the gas replacement chamber, and the flow of gas in the gas replacement chamber at this time causes the predetermined gas to be supplied via the supply opening in the frame to the first space, and causes the gas in the first space to be exhausted via the exhaust opening.

An exhaust device may be provided in order to exhaust the gas, exhausted from the first space to the gas replacement chamber, thereby shortening the time taken to replace the gas.

The supply opening of the frame and the supply opening of the gas supply device may be provided opposite each other. Furthermore, the exhaust opening of the frame and the exhaust opening of the gas exhaust device may be provided opposite each other. In this case, the predetermined gas, which has flowed through the supply opening of the gas supply device, maintains an approximately steady fluidity as it flows from the supply opening of the frame to the first space, and gas flows out from the exhaust opening in the first space.

The gas replacement chamber may comprise a gas supply device having a supply nozzle connected to the supply opening in the frame, and a gas exhaust device having an exhaust nozzle connected to the exhaust opening in the frame. In this case, the gas supply nozzle leads the predetermined gas, supplied from the gas supply device, via the supply opening in the frame directly to the first space. In addition, the gas exhaust nozzle leads the gas in the first space via the exhaust opening in the frame directly to the gas replacement mechanism. Consequently, little of the predetermined gas is wasted when replacing gas in the first space.

The gas replacement chamber may be equipped with a detection device which detects pressure change in the first space, and a control device which maintains the pressure in the first space at a predetermined pressure by controlling at least one of the gas supply device and the gas exhaust device based on a detection result of the detection device. In this case, since the control device maintains the pressure of the first space at a predetermine ed pressure based on a detection result of the detection device, breakage of the protection member can be reliably prevented.

The detection device may comprise a displacement sensor which detects displacement of the protection member, whereby pressure change of the first space can easily be detected from the outside.

The gas replacement chamber may be equipped with an optical cleaning device which cleans at least one of the mask and the protection member. Since the optical cleaning device decomposes by oxidization the light-absorptive substance which has adhered to the protection member and the mask, the exposure light reliably passes the mask having the protection member.

Another aspect of the present invention provides an exposure method comprising providing a mask having a first space formed by a protection member, which protects a pattern formation area on a mask substrate, and a frame, which supports the protection member, inside a second space, and transferring the pattern of the mask provided in the second space onto a substrate by using an energy beam from a light source. The gas in the first space is replaced with a predetermined gas, through which the energy beam can pass, while maintaining a predetermined pressure in the first space.

This exposure method replaces the gas in the first space, formed by the protection member and the frame, with the predetermined gas while maintaining a predetermined pressure in the first space. Therefore, deforming of the protection member due to pressure change is reduced, and breakage of the protection member is prevented.

Another aspect of the present invention provides a device manufacturing method using a photolithography process. In the photolithography process, the device is manufactured by using the exposure method apparatus mentioned above.

In this device manufacturing method, the device is manufactured by using the exposure method apparatus according to the present invention described above. Therefore, the substrate is illuminated by exposure light having a sufficient luminance, increasing the precision of the pattern of the device.

Another aspect of the present invention provides an exposure method using a mask having a first space formed by a protection member, which protects a pattern formation area on a mask substrate, and a frame, which supports the protection member, and transfers the pattern of the mask onto a substrate by using a beam from a light source. The method comprises accommodating the mask in a second space, to which a transparent gas through which the beam can pass is supplied, moving the mask in a predetermined direction inside the second space, and feeding the gas into the first space via an opening (or openings) formed in the frame.

In this exposure method, the movement of the mask feeds the gas, which the beam from the light source passes through, via the opening provided in the frame to the first space of the mask. The flow of the gas reduces the light-absorptive substance in the first space. Therefore, the beam from the light source reaches the substrate with a sufficient luminance, increasing the exposure precision.

A plurality of openings may be formed facing each other in the frame. The predetermined direction may comprise the direction which the plurality of openings are facing. In this case, the gas flows smoothly through the plurality of openings to the first space.

The exposure method for transferring the pattern of the mask to the substrate may comprise a scanning exposure method wherein the mask and the substrate are moved in synchrony. The predetermined direction may comprise the direction of the scanning. In this case, by scanning the mask, the gas can be fed smoothly to the first space.

By moving the mask in the predetermined direction inside the second space and replacing the gas in the first space with the predetermined gas prior to transferring the pattern of the mask to the substrate, the beam from the light source can reach the substrate with a sufficient luminance.

The second space may be an internal space of the mask chamber, which the mask is accommodated in when transferring the pattern of the mask to the substrate. By moving the mask in the predetermined direction inside the mask chamber when transferring the pattern of the mask to the substrate, the gas may be fed to the first space. This reduces the light-absorptive substance in the first space during transferring of the pattern of the mask, and maintains the reduction of the light-absorptive substance in the first space. The light-absorptive substance exhausted from the first space enters the second space, and may absorb light. However, a high-purity purge gas is fed into the second space to prevent buildup therein, and enabling the gas to be exhausted easily.

The second space may be an internal space of the mask chamber, which the mask is accommodated in when transferring the pattern of the mask to the substrate. When exchanging the substrate with another substrate, the mask may be moved in the predetermined direction inside the mask chamber so as to feed the gas into the first space. During substrate exchange, the light-absorptive substance in the first space is reduced and is maintained in this reduced state.

The second space may be provided separately from the mask chamber, which the mask is accommodated in at the time of transferring the pattern of the mask to the substrate, and may comprise an internal space of a preparation chamber, which the mask to be accommodated in the mask chamber is temporarily accommodated in. This makes it possible to accommodate the mask, which has reduced light-absorptive substance in its first space land is accommodated in the preparation chamber, in the mask chamber.

In this case, another mask, which is separate to the mask accommodated in the mask chamber, may be moved in the predetermined direction in the preparation chamber while feeding the gas into the first space of the mask. The mask in the mask chamber can thereby be speedily exchanged with the mask having reduced light-absorptive substance in its first space.

The protection member and/or the mask in the second space may be optically cleaned. The light-absorptive substance which has adhered to the mask and/or the protection member is decomposed by oxidization and discharged into the gas.

It is acceptable to detect information relating to the density of impurities in the first space, and to move the mask in the second space in the predetermined direction based on the detection result. In this case, the density of impurities (light-absorptive substance) in the first space can be reliably reduced.

BRIEF DESCRIPTION OF THE DRAWINGS

FIGS. 2A and 2B are plan and cross-sectional views for explaining a mask (reticle) which a pellicle has been attached to.

DETAILED DESCRIPTION OF THE PREFERRED EMBODIMENTS

Figure 1:
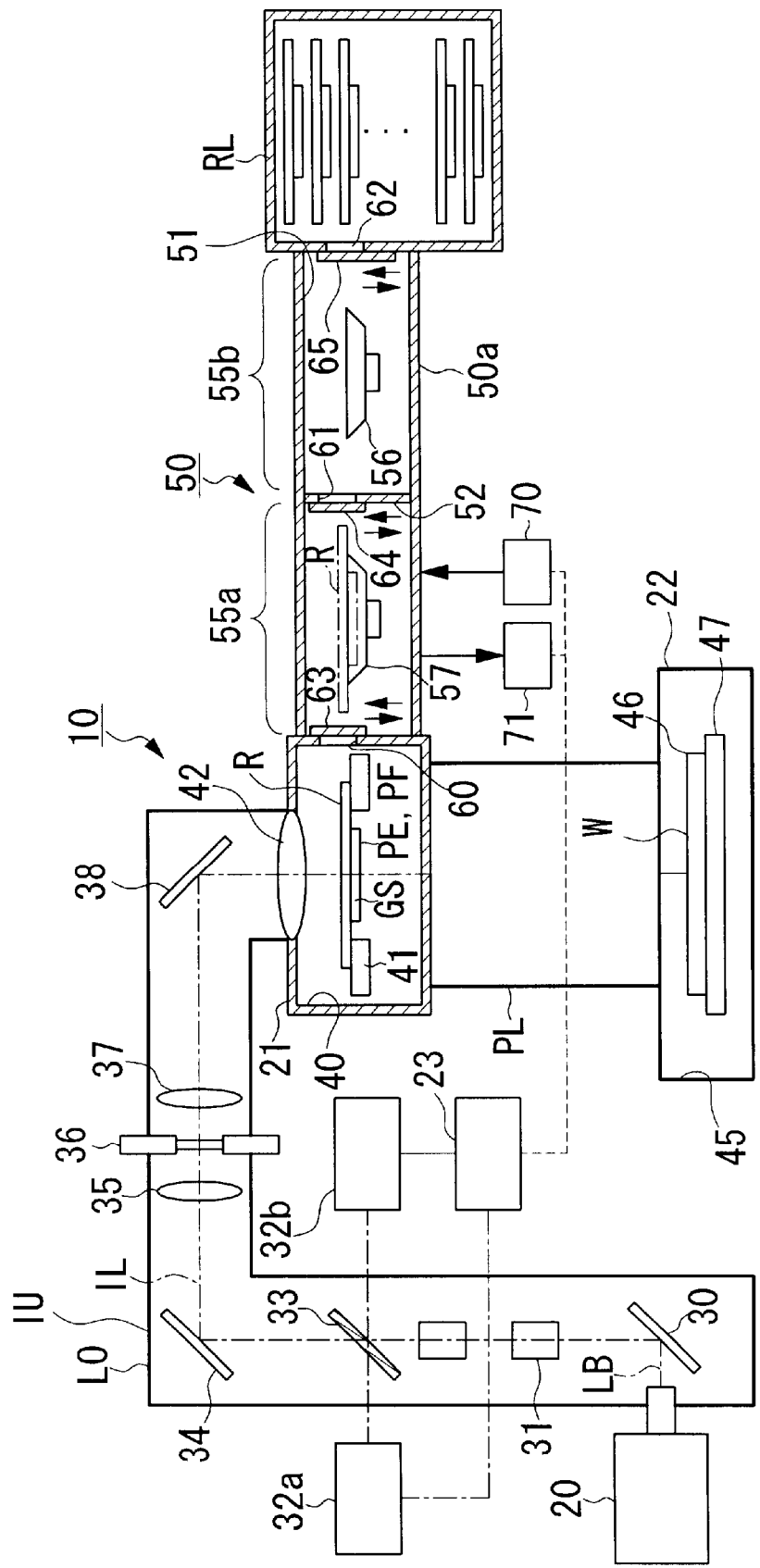
FIG. 1 is a diagram showing the constitution of a first embodiment of an exposure apparatus according to the present invention.

An exposure apparatus according to the first embodiment of the invention will now be described with reference to the accompanying drawings. FIG. 1 is a diagram showing the schematic constitution of an exposure apparatus 10 according to the present invention.

The exposure apparatus 10 is a reduction projection exposure apparatus which uses a step-and-scan method to synchronously move a mask as a reticle R and a substrate as a wafer W in a primary direction, while transferring the image of a pattern provided on the reticle R onto shot areas on the wafer W via a projection optical system PL.

The exposure apparatus 10 comprises a light source 20, and an illumination optical system LO which illuminates the reticle R with a flux of rays LB from the light source 20, a reticle chamber 21 which accommodates the reticle R, the projection optical system PL which projects exposure light IL, illuminated from the reticle R, onto the wafer W, a wafer chamber 22 which accommodates the wafer W, a main controller 23, and the like.

The light source 20 emits exposure light of vacuum ultraviolet rays having a wavelength of approximately 120 nm to 180 nm onto the illumination optical system 2. For example, the light source 20 may be selected from a fluorine laser ($F_2$ laser) of an oscillation wavelength of 157 nm, a krypton dimer laser ($Kr_2$ laser) of an oscillation wavelength of 146 nm, an argon dimer laser ($Ar_2$ laser) of an oscillation wavelength of 126 nm and so forth. An ArF excimer laser of an oscillation wavelength of 193 nm or the like may also be used as the light source 20.

The illumination optical system LO has a mirror 30 which bends the flux of rays LB from the light source 20 in a predetermined direction, an optical integrator 31 which converts the flux of rays LB, which has been guided by the mirror 30, to the exposure light EL with a nearly uniform illumination distribution, a beam splitter 33 which allows most of the exposure light EL (e.g. 97%) to pass and guides the remaining portion (e.g. 3%) to an integrator sensor 32b, a reticle blind 36 which defines a predetermined illumination range of the exposure light IL, which has passed the beam splitter 33 and has been guided by a mirror 34, a relay lens 35 and the like, and a relay lens 37 and a mirror 38 and the like which guide the exposure light IL, which has passed an opening in the reticle blind 36, to the reticle chamber 21.

There is further provided a reflectance monitor 32a which receives the exposure light IL, which has passed the beam splitter 33 and been reflected from the wafer or from a plurality of optical members provided between the beam splitter 33 and the wafer, via the beam splitter.

The reflectance monitor 32a and the integrator sensor 32b, which comprise a photoelectric converting element or the like, photoelectrically convert a part of the exposure light IL guided by the beam splitter 33 to an electric signal and supply the electric signal to the main controller 23. That is, the main controller 23 activates or deactivates the light source 20 based on information from the reflectance monitor 32a and the integrator sensor 32b, thereby controlling the amount of exposure (the amount of illumination of the exposure light) to the wafer W.

Prior to the exposure operation, the output signal from the integrator sensor 32b is correlated with the output signal from an illumination amount monitor, which is attached to a wafer stage 47, obtained by receiving the exposure beam IL passed through the projection optical system.

The reticle blind 36 has a pair of blades (not depicted in figures) having, for example, a plane L shape and a cut-off displacement device (not depicted in figures) which displaces the blades within a plane perpendicular to the optical axis of the exposure light IL based on an instruction from the main controller 23. The pair of blades form a rectangular opening as they are combined within the plane perpendicular to the optical axis. The blades are placed on a face being conjugate with the pattern face of the reticle R. The size of the opening in the reticle blind 36 changes as the blades move, and the exposure light IL that has been defined by the opening illuminates a predetermined area of the reticle R placed in the reticle chamber 21 with an approximately uniform luminance via a relay lens 37.

The reticle chamber 21 is formed by a partition 40 which is seamlessly connected to a housing of the illumination-system LO and a housing IU of the projection-system housing PL. A reticle holder 41 which holds the reticle R by vacuum chucking is provided in the internal space of the reticle chamber 21.

In this embodiment, the partition 40 constructs a single unit (hereinafter called "reticle chamber") having an airtight structure in which an internal space is airtight. Here, the airtight structure may be a completely airtight structure, which is completely cut-off from gas outside the reticle chamber, or a structure wherein the pressure inside the reticle chamber is higher than the atmospheric pressure, whereby gas inside the space leaks to the outside. Alternatively, the pressure may be the same inside and outside the reticle chamber so that there is almost no flow of gas between the inside and outside of the reticle chamber.

The reticle holder 41 has an opening corresponding to a pattern area where a pattern is formed on the reticle R, and is slightly movable in the X direction, Y direction and θ direction (the rotational direction about the Z axis) by an unillustrated drive mechanism. This structure can allow the reticle R to be positioned so that the center of the pattern area passes the optical axis of the projection optical system PL. The drive mechanism for the reticle holder 41 is constituted by, for example, using two sets of voice coil motors.

An optical member 42 separates the internal space of the housing in the illumination optical system LO from the internal space of the reticle chamber 21, and is provided in the ceiling portion of the partition 40 of the reticle chamber 21. Because the optical member 42 is positioned on the optical path of the exposure light IL that is illuminated on the reticle R by the illumination optical system LO, it is made of a crystal material having a high transmittance to the exposure light IL comprising vacuum ultraviolet rays.

The projection optical system PL has a plurality of optical members, such as a lens, formed of a fluoride crystal, such as fluorite or lithium fluoride, and a reflector, sealed by the housing (lens-barrel). In this embodiment, a reduction optical system having a projection magnification of, for example, ¼ or ⅕, is used as the projection optical system PL. For this reason, when the reticle R is illuminated by the exposure light IL from the illumination optical system LO, a reduced image of the pattern provided on the reticle R is transferred to a predetermined area (shot area) on the wafer W by the projection optical system PL. The individual optical members of the projection optical system PL are supported by the housing via respective holding members (not illustrated) which are, for example, formed in a ring shape so as to hold the peripheral edges of the optical members.

The wafer chamber 22 is formed by a partition 45 which is seamlessly connected to the housing IU of the projection optical system PL. In an internal space of the wafer chamber 22, there are provided a wafer holder 46 which holds the wafer W by vacuum chucking, and a wafer stage 47 which supports the wafer holder 46.

In this embodiment, the wafer chamber formed by the partition 45 comprises an airtight structure which is defined in the same manner as the reticle chamber.

The wafer stage 47 is for example driven freely in a horizontal direction along the X-Y plane (the direction perpendicular to the optical axis of the projection optical system PL) by a drive system (not illustrated) which comprises a magnetic floating secondary linear actuator (plane motor). The position of the wafer stage 47 is adjusted by a laser interferometer system comprising an optical member, such as a laser light source and a prism, and a detector and the like. The member which constitutes the laser interferometer system is provided outside the wafer chamber 22 in order to prevent the exposure light from being adversely affected by impurities generated by the member. When the generation of light-absorptive substance from the components which constitute the laser interferometer is sufficiently restricted, the components may be provided in the wafer chamber 22.

In the wafer chamber 22, a predetermined shot area on the wafer W is positioned at the projection position (exposure position) of the pattern on the reticle R by moving the wafer stage 47 in the X-Y plane, and the image of the pattern on the reticle R is transferred thereto. Consequently, according to the exposure apparatus of this embodiment, the main controller 23 repeatedly executes an inter-shot stepping operation, which moves the wafer stage 47 so as to sequentially position the shot areas on the wafer W at the exposure start position, and an exposure operation which transfers the pattern of the reticle R onto the short area of the wafer W while synchronously moving the reticle R and the wafer W horizontally along the X-Y plane.

When light whose wavelength lies in the range of vacuum ultraviolet rays is used as the exposure light IL, it is necessary to exhaust a gas which comprises a material (hereinafter called "light absorptive substance") such as molecules of oxygen, water, or carbon dioxide, that is, a gas (hereinafter called "light absorptive gas") which demonstrates high absorption with respect to light of that wavelength band, from the optical path. Therefore, in this embodiment, the space on the optical path, that is, the individual internal spaces of the illumination optical system LO, the reticle chamber 21, the projection optical system PL, and the wafer chamber 22, is filled with a gas which has low absorption with respect to the light of vacuum ultraviolet range, such as nitrogen, helium, argon, neon or krypton, or a gas mixture thereof (hereinafter called "low-light absorptive substance" or "predetermined gas"). The pressure of this gas is made higher than the atmospheric pressure, specifically approximately 1 to 10% higher than the atmospheric pressure. The shape and position (angle of incline and the like) of the members provided in the space on the optical path (e.g. the holding members for supporting the optical members and the like) are set so that there is no gas reservoir space (gas stagnating space).

At the time of loading the reticle R into the reticle chamber 21, when even a slight amount of, outside air enters the reticle chamber 21 with the reticle R, the light absorptive substance contained in the outside air absorbs the exposure light IL considerably, resulting in an unallowable reduction or variation in transmittance. This embodiment provides a reticle loading path 50 having a space filled with a low absorptive gas between the reticle library RL for storing the reticle R and the reticle chamber 21. The reticle library RL has a plurality of shelves for storing the respective reticles, and an internal space which is filled with the low absorptive gas of a predetermined pressure.

The reticle loading path 50 is formed by seamlessly joining a partition 51 to the partition 40 of the reticle chamber 21 and the reticle library RL, and has an internal space at a different position to the optical path of the exposure light IL. Like the space on the optical path, the pressure (air pressure) in the internal space on the reticle loading path 50 is higher than the atmospheric pressure, but is lower than that of the reticle chamber 21 and the reticle library RL in order to prevent seepage of impurities from the reticle loading path 50 to other places.

Generally, a transparent thin protection member called a pellicle is attached to the pattern side face of the reticle R to prevent impurities from adhering to the pattern formation area.

Figure 2A:
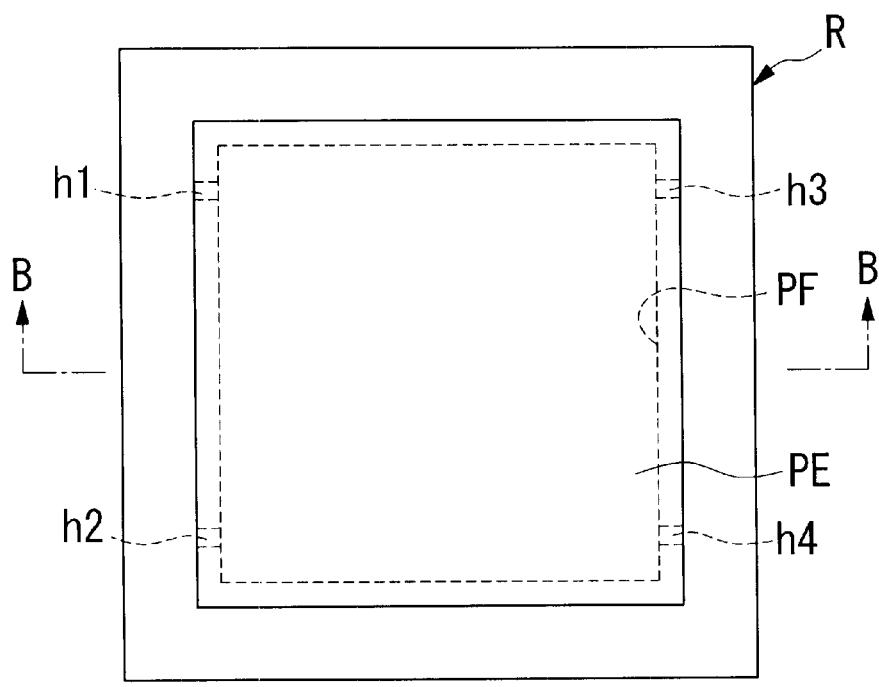
Figure 2B:
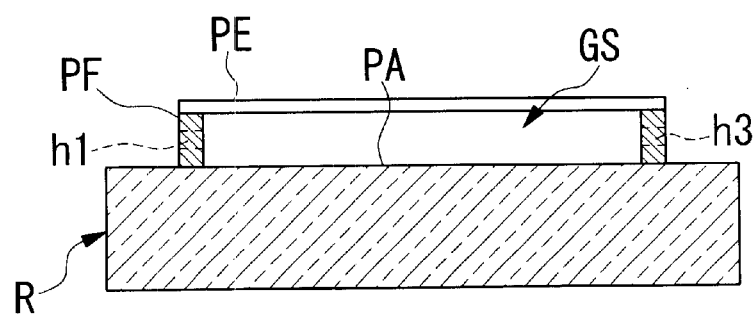

As shown in FIGS. 2A and 2B, the pellicle PE is adhered to the pattern face PA of the reticle R via a metal frame called a pellicle frame PF. A transparent thin film of about 1 to 2 $\mu$m thick, whose essential component is nitrocellulose or the like is conventionally used as the pellicle PE. In this embodiment, to effectively pass the exposure light IL of vacuum ultraviolet rays having a wavelength of about 120 nm to 180 nm, a film-like member comprising a crystal material which is the same material for the reticle M and the lens systems, such as fluorite, magnesium fluoride or lithium fluoride, may also be used. Also available as the pellicle PE is a quartz glass (fluorine-doped quartz or the like) having a thickness of, for example, about 0.1 mm to 0.5 mm.

An internal space GS is formed between the pellicle PE and the pattern face PA by the pellicle PE and the pellicle frame PF. Formed on the pellicle frame PF are ventilation holes h (h1, h2, h3, h4) to prevent the pellicle PE from being broken by a change in atmospheric pressure. When the atmospheric pressure drops and the gas in the space GS expands due to transportation by aircraft, a change in weather or the like, for example, the ventilation holes h reduce the sealing ability of the space GS to thereby prevent the pellicle PE from being damaged.

As described above, the reticle R is accommodated in the reticle chamber 21 and provided on the optical path of the exposure light IL. Therefore, at the time of loading the reticle R into the reticle chamber 21, light-absorptive substance in the space GS must be reduced.

Accordingly, in this embodiment, as shown in FIG. 1, the reticle loading path 50 is formed by a partition 50a provided between the reticle chamber 21 and the reticle library RL. A side wall 52 is provided in the partition 50a. The side wall 52 divides the internal space of the reticle loading path 50 into a plurality of spaces (in this embodiment, a reticle-gas replacement chamber 55a and a reticle loading chamber 55b).

The reticle-gas replacement chamber 55a is a space formed between the partition 50a, the side wall 52, and a section of the partition 40 which comprises the reticle chamber 21. The partition 50a, the side wall 52, and the section of the partition 40 form a second unit (hereinafter termed "reticle gas replacement chamber 55a") which is different from the reticle chamber 21. This second unit has an airtight structure which is defined in the same manner as the reticle chamber.

As already mentioned, the pressure in the space in the reticle loading path 50 is higher than the atmospheric pressure, while being lower than the pressure in the reticle chamber 21 and the reticle library RL. Furthermore, the pressure in the reticle-gas replacement chamber 55a is higher than that in the reticle loading chamber 55b. That is, the pressure of the reticle loading chamber 55b is higher than the atmospheric pressure and lower than the pressure in the reticle chamber 21, the reticle library RL, and the reticle gas replacement chamber 55a.

The reticle loading path 50 comprises a first reticle loading system 56 which loads the reticle R between the reticle library RL and the reticle gas replacement chamber 55a, and a second reticle loading system 57 which loads the reticle R between the first reticle loading system 56 and the reticle chamber 21. The first and second reticle loading systems 56 and 57 are connected to the main controller 23, and operate the internal spaces of the reticle loading path 50 (i.e., the reticle-gas replacement chamber 55a and the reticle loading chamber 55b) based on instructions from the main controller 23.

Openings 60, 61, and 62 are provided in the partition 51 of the reticle loading path 50 (or the partition 40 of the reticle chamber 21) and the side wall 52, and allow the reticle to be inserted and removed. The openings 60, 61, and 62 have respective doors 63, 64, and 65 which open and close in accordance with an instruction from the main controller 23.

The reticle-gas replacement chamber 55a will be explained in detail by referring to FIGS. 3A and 3B.

The reticle-gas replacement chamber 55a has a gas replacement mechanism which replaces the gas in the space GS (here, a predetermined gas whose level of purity has decreased due to the adverse effect of the light absorptive substance) with a predetermined gas which passes exposure light. That is, the reticle-gas replacement chamber 55a comprises a gas supply device 70, which supplies a predetermined gas into the reticle gas replacement chamber 55a, and a gas exhaust device 71 which exhausts a predetermined gas in the reticle gas replacement chamber 55a. The gas supply device 70 and the gas exhaust device 71 operate based on instructions from the main controller 23 (see FIG. 1).

The gas supply device 70 comprises a supply nozzle 74 having a supply opening 73 provided in the internal space of the reticle gas replacement chamber 55a, and a supply valve 75. The quantity of flow through the supply valve 75 can be adjusted by the control of the main controller 23. A low absorptive gas (such as nitrogen, helium, argon), which can pass the exposure light and has low absorption of the exposure light, is supplied to the reticle gas replacement chamber 55a from an unillustrated gas supply source via the supply opening 73 at a predetermined flow rate.

The gas exhaust device 71 has an exhaust nozzle 77 comprising an exhaust opening 76 provided in the internal space of the reticle gas replacement chamber 55a, and an exhaust valve 78. The quantity of flow through the exhaust valve 78 can be adjusted by the control of the main controller 23. The gas exhaust device 71 exhausts the gas in the reticle-gas replacement chamber 55a to the outside via the exhaust opening 76.

One or multiple supply nozzles 74 of the gas supply device 70 is/are provided (two are provided in this embodiment) so that the supply openings 73 of the supply nozzles 74 face at least one of the ventilation holes h (h3 and h4) provided in the pellicle frame PF. Similarly, one or multiple exhaust nozzles 77 of the gas exhaust device 71 is/are provided (two are provided in this embodiment) so that the exhaust openings 76 of the exhaust nozzles 77 face at least one of the ventilation holes h (h3 and h4) provided in the pellicle frame PF.

Of the ventilation holes h provided in the pellicle frame PF, the ventilation holes h3 and h4 (hereinafter termed "gas-supply openings") which face the supply openings 73 of the supply nozzles 74, and the ventilation holes h1 and h2 (hereinafter termed "gas-exhaust openings") which face the exhaust openings 76 of the supply nozzles 73, are provided facing each other respectively with the space GS therebetween. The area of the supply openings 73 of the supply nozzles 74 and the exhaust openings 76 of the exhaust nozzles 77 should preferably be greater than the area of the ventilation holes h.

Since the exposure apparatus 10 is equipped with the reticle-gas replacement chamber 55a of this constitution, the light-absorptive substance in the space GS is reduced at the time of loading the reticle R into the reticle chamber 21. That is, at the time of loading the reticle R from the reticle library RL shown in FIG. 1 into the reticle chamber 21, the reticle R is temporarily accommodated in the reticle-gas replacement chamber 55a, and the gas in the space GS of the reticle R is replaced with the low-absorptive gas.

A series of operations of loading the reticle R from the reticle library RL to the reticle chamber 21 will be explained mainly referring to the control operation of the main controller 23.

It is assumed that the space on the optical path (the individual internal spaces of the illumination optical system LO, the reticle chamber 21, the projection optical system PL, and the wafer chamber 22), the internal space of the reticle loading path 50 (comprising the reticle-gas replacement chamber 55a and the reticle loading chamber 55b) and the internal space of the reticle library RL are each filled beforehand with a low absorptive gas and set to a predetermined pressure. This reduces the light-absorptive substance in each of the spaces, and prevents infiltration of impurities from the outside.

In FIG. 1, at the time of loading the reticle R, the main controller 23 uses the first reticle loading system 56 in the reticle loading chamber 55b to take out the reticle R, accommodated in the reticle library RL. When the door 65 has been closed, loading of the reticle R toward the reticle-gas replacement chamber 55a starts. When the first reticle loading system 56 comes within a predetermined distance from the reticle-gas replacement chamber 55a, the main controller 23 opens the door 64, provided in the side wall 52. At this time, the opening 60 in the interface between the reticle-gas replacement chamber 55a and the reticle chamber 21 is closed by the door 63.

Next, the main controller 23 causes the first reticle loading system 56 holding the reticle R to transfer the reticle R via an opening 61 to the second reticle loading system 57 in the reticle-gas replacement chamber 55a.

As the door 64 of the side wall 52 is open at this time, the gas can enter and leave through the opening 61. However, as described above, since the pressure of the reticle loading chamber 55b is higher than the atmospheric pressure and lower than the individual pressures of the reticle chamber 21, the reticle library RL, and the reticle-gas replacement chamber 55a, the light-absorptive substance in the space GS exhausted inside the reticle-gas replacement chamber 55a flows to the reticle loading chamber 55b, and not to the reticle chamber 21 and the reticle library RL. Therefore, by providing an exhaust device for exhausting gas from the reticle loading chamber 55b, it is possible to exhaust the light-absorptive substance, which has entered from the reticle-gas replacement chamber 55a, from the reticle loading path 50.

After the reticle R has been transferred, the main controller 23 closes the door 64. Consequently, the reticle-gas replacement chamber 55a becomes a highly airtight space. That is, the reticle R with the pellicle PE mounted thereon is accommodated in the reticle-gas replacement chamber 55a which is an airtight chamber.

When the reticle R is accommodated in the reticle-gas replacement chamber 55a, the main controller 23 uses the gas supply device 70 and the gas exhaust device 71 to replace the gas in the space GS formed by the pellicle PE of the reticle R and the pellicle frame PF. Generally, gas replacement is carried out by reducing the pressure in a predetermined space to, for example, approximately 0.1 [hPa] (pressure reduction process), and thereafter supplying a gas for replacement to the space. In this embodiment, however, the supply and exhaust of gas to/from the space is performed simultaneously, thereby replacing the gas without the pressure reduction process.

Figure 3A:
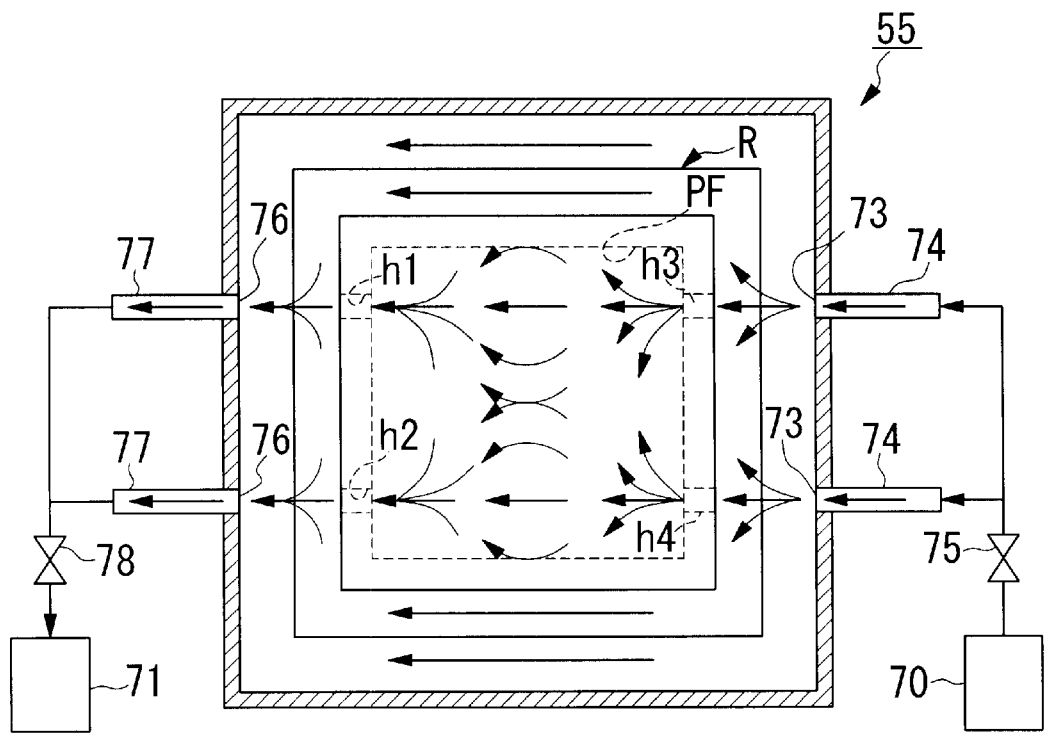
FIGS. 3A and 3B are cross-sectional views of a reticle gas replacement chamber of the first embodiment.
Figure 3B:
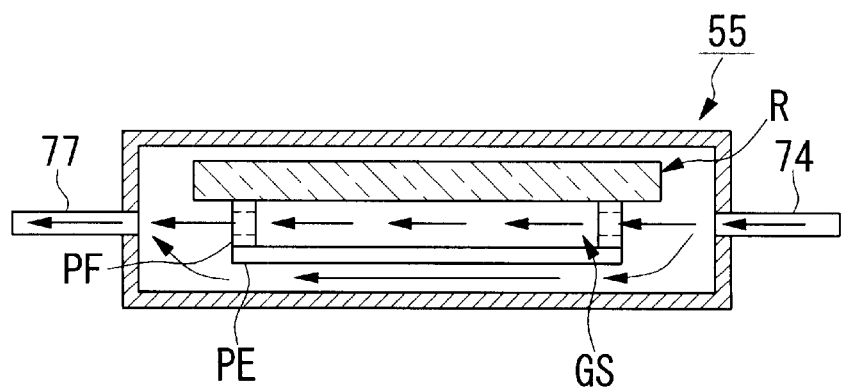

As shown in FIGS. 3A and 3B, the main controller 23 opens the supply valve 75 and drives the gas supply device 70 so as to supply the low-absorptive gas (such as nitrogen, helium, and argon) into the reticle-gas replacement chamber 55a. Simultaneously, the main controller 23 opens the exhaust valve 78 and drives the gas exhaust device 71 so as to exhaust the gas from the reticle-gas replacement chamber 55a. The main controller 23 (see FIG. 1) controls the supply valve 75 and the exhaust valve 78 so that the same amount of gas is supplied and exhausted per unit of time, or so that the low-absorptive gas flows into the space GS.

At this time, the flow of gas in the reticle-gas replacement chamber 55a causes the gas in the space GS to flow, and the gases are flowed in and out of the internal space of the reticle-gas replacement chamber 55a and the space GS via the ventilation holes h3 and h4 and exhaust holes h1 and h2, provided in the pellicle frame PF.

That is, since the ventilation holes h3 and h4 of the pellicle frame PF and the supply holes 73 in the supply nozzles 74 are provided facing each other, part of the low absorptive gas which has flowed from the supply nozzle 74 into the reticle-gas replacement chamber 55a approximately maintains its fluidity as it enters the space GS from the ventilation holes h3 and h4 of the pellicle frame PF. On the other hand, since the exhaust holes h1 and h1 of the pellicle frame PF and the exhaust holes 76 of the exhaust nozzles 77 are provided facing each other, the flow of gas created by the absorption effect of the exhaust nozzles 77 pushes the gas out from the space GS, whereby the gas flows from the exhaust holes h1 and h2 into the internal space of the reticle-gas replacement chamber 55a. Since the ventilation holes h3 and h4 and the exhaust holes h1 and h1 of the pellicle frame PF are facing each other, most of the gas in the space GS flows stably in one direction (the direction leading from the ventilation holes h3 and h4 toward the exhaust holes h1 and h2). The flow of the gas in the space GS allows the low absorptive gas to become mixed into the gas in the space GS, whereby the gas in the space GS is gradually replaced by the low absorptive gas and the light-absorptive substance is consequently discharged from the space GS. The gas which has been exhausted from the space GS to the reticle-gas replacement chamber 55a is exhausted via the exhaust holes 76 of the nozzles 77 to the outside of the reticle-gas replacement chamber 55a.

At this time, as described already, the same amount of gas per unit of time is supplied and exhausted to/from the reticle-gas replacement chamber 55a. Therefore, there is almost no change in the overall pressure in the reticle-gas replacement chamber 55a. The space GS is connected to the reticle-gas replacement chamber 55a via the ventilation holes h3 and h4 and the exhaust holes h1 and h2, and gas is gradually fed from/to the reticle-gas replacement chamber 55a. Therefore, the space GS and the reticle-gas replacement chamber 55a maintain approximately the same pressure and there is no considerable pressure difference between them.

This restricts deforming of the pellicle PE due to pressure change, and prevents the pellicle PE from breaking.

When the gas in the space GS is replaced by the low absorptive gas, the main controller 23 shown in FIG. 1 controls the gas supply device 70 and the gas exhaust device 71 so as to stop the gas replacement operation. Thereafter, the main controller 23 closes the door 63 and places the reticle R on the reticle holder 41 inside the reticle chamber 21. To determine whether the gas in the space GS has been replaced by the low absorptive gas, a gas density meter (for example, a nitrogen density meter, a dew-point meter, or the like) may be provided midway along the exhaust pipe on the gas exhaust device 71 side in order to measure the density, the determination being made based on the measurements of the density of absorptive substance in the gas exhausted from the reticle-gas replacement chamber 55a, and the density of the low absorptive gas, which are taken by the gas density meter.

Although the door 63 is open at this time, since the pressure in the reticle-gas replacement chamber 55a is lower than that in the reticle chamber 21 as already mentioned, almost none of the gas flows from the reticle-gas replacement chamber 55a to the reticle chamber 21. The flow of gas from the reticle-gas replacement chamber 55a to the reticle chamber 21 comprising the space on the optical path is thereby prevented. Therefore, even when the gas (containing light absorptive substance) of the space GS remains in the reticle-gas replacement chamber 55a, there is little possibility that it will leak to the reticle chamber 21.

In this embodiment, the main controller 23 terminates the operation of replacing the gas in the space GS in the reticle-gas replacement chamber 55a after a predetermined period of time has elapsed. The timing of terminating the gas replacement operation is not restricted to this, and may be determined by, for example, based on a measurement taken by a gas density meter which measures the density of the absorptive substance in the gas exhausted from the reticle-gas replacement chamber 55a, as described above.

When the reticle R has been loaded to the reticle chamber 21 from the reticle library by the abovementioned series of operations, the main controller 23 performs an exposure process of illuminating the exposure light IL onto the reticle R, held by the reticle holder 41, thereby transferring an image of the pattern formed on the reticle R to the wafer W, held by the wafer holder 46.

That is, according to the exposure apparatus of this embodiment, the reticle-gas replacement chamber 55a replaces the gas in the space GS with the low absorptive gas while maintaining a predetermined pressure in the space GS. Therefore, the light absorptive substance in the space GS is reduced stably without breaking the pellicle PE. By using the flow of the gas in the reticle-gas replacement chamber 55a, the gas is fed into the space GS of the reticle R, thereby enabling the gas in the space GS to be replaced in a short period of time without a process of reducing the pressure. Since the light absorptive substance in the space GS on the optical path is exhausted, the exposure light IL passes the reticle R and reaches the wafer W with a sufficient degree of illumination.

In the case where the reticle loading path 50 (comprising the reticle-gas replacement chamber 55a and the reticle loading chamber 55b) contains a comparatively large amount of light absorptive substance, the gas replacement operation described above reduces the density of the light absorptive substance in the reticle-gas replacement chamber 55a, thereby preventing pollution of the reticle chamber 21 when loading the reticle R to the reticle chamber 21.

When reducing the pressure in the space GS of the reticle R, the pressure must be reduced at an extremely slow speed in order to prevent the pellicle PE from breaking. This takes a very long time. By keeping the pressure in the space GS the same as the atmospheric pressure, as in this embodiment, the time required by such a pressure-reduction operation can be saved.

In this embodiment, after the gas in the space GS in the reticle-gas replacement chamber 55a has been replaced, the reticle R is loaded to the reticle chamber 21. Then, as will be described later, the replacement of gas in the space GS may be continued by using a reticle stage in the reticle chamber 21.

Figure 4A:
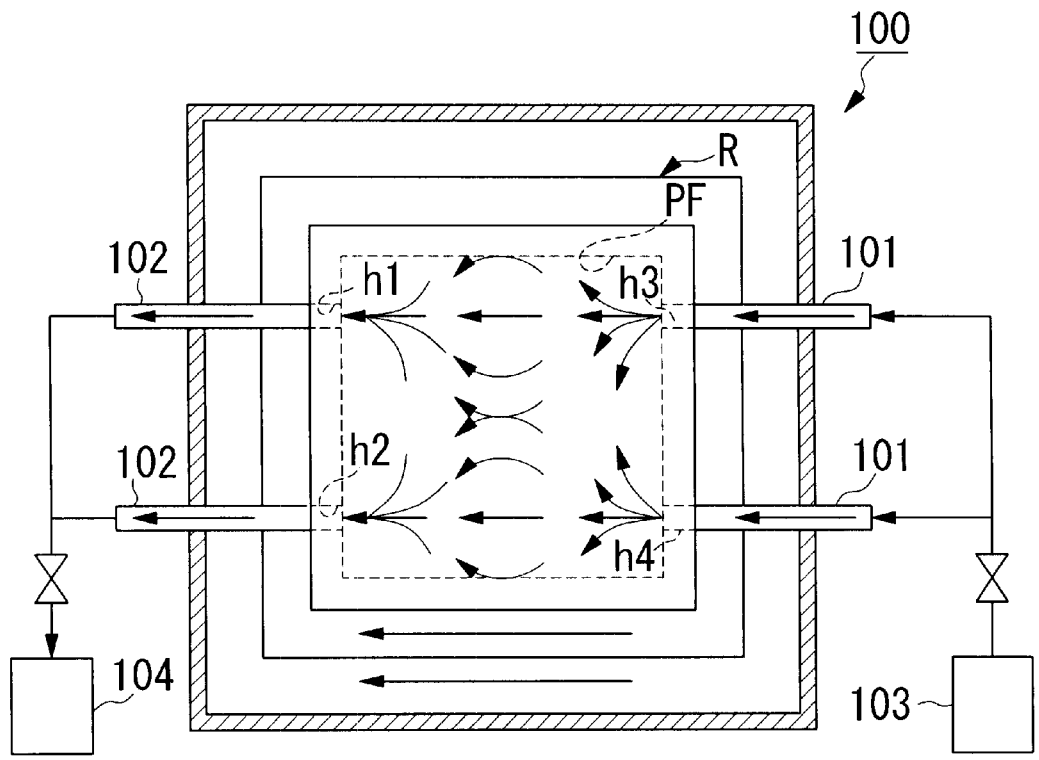
FIGS. 4A and 4B are cross-sectional views for explaining a second embodiment of the exposure apparatus according to the present invention.
Figure 4B:
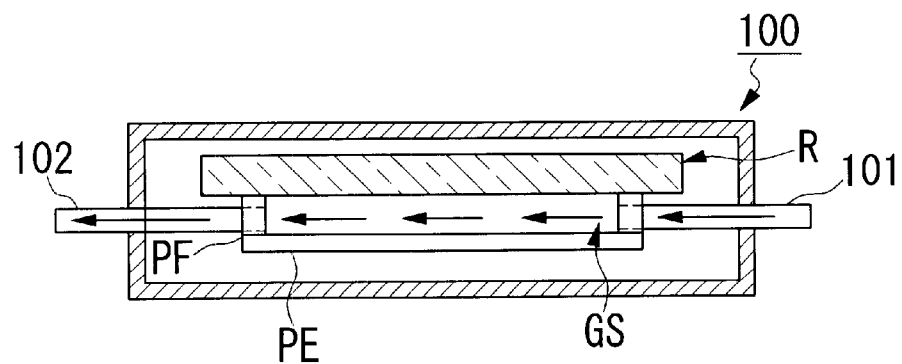

Next, a second embodiment of the present invention will be explained with reference to FIGS. 4A and 4B.

The second embodiment differs from the first embodiment in respect of the point that the supply nozzles 74 and the exhaust nozzles 77 of the first embodiment open to the internal space of the reticle-gas replacement chamber 55a, whereas the supply nozzles 101 and the exhaust nozzles 102 of the second embodiment connect to the ventilation holes h in the pellicle frame PF of the reticle R, accommodated in the reticle-gas replacement chamber 55a.

That is, the reticle-gas replacement chamber 100 of this embodiment comprises a gas supply device 103 having supply nozzles 101 which connect to the ventilation holes h (supply holes h3 and h4) of the pellicle frame PF, and a gas exhaust device 104 having exhaust nozzles 102 which connect to the ventilation holes h (exhaust holes h1 and h2) of the pellicle frame PF.

According to this constitution, in this embodiment, the low absorptive gas, supplied from the gas supply device 103, is directly supplied to the space GS of the reticle R via the supply nozzles 101 without passing through the internal space of the reticle-gas replacement chamber 100. In addition, the gas exhaust device 104 directly exhausts the gas in the space GS via the exhaust nozzles 102.

Therefore, the low absorptive gas from the gas supply device 103 is supplied without waste to the space GS, and the gas in the space GS is easily exhausted to the outside by the gas exhaust device 104, whereby the gas in the space GS can be replaced more efficiently and in a shorter period of time than in the first embodiment.

At this time, since almost none of the gas in the space GS flows to the internal space of the reticle-gas replacement chamber 100, the gas in the reticle-gas replacement chamber 110 should preferably be replaced by a separate low absorptive gas. Pollution of the reticle-gas replacement chamber 100 by light absorptive substance is thereby prevented.

In this case, when replacing the gas in the space GS, the gas supply device 103 and the gas exhaust device 104 control the amounts of gas which are supplied and exhausted so that the pressure in the space GS is about the same as the pressure in the internal space of the reticle-gas replacement chamber 100, thereby preventing breakage of the pellicle PE.

A movable mechanism may be provided to enable the supply nozzles 101 and the exhaust nozzles 102 to move, and the reticle R may be accommodated inside the reticle-gas replacement chamber 100. Thereafter, the supply nozzles 101 and the exhaust nozzles 102 are shifted so as to connect to the supply holes h3 and h4 and the exhaust holes h1 and h2 of the pellicle frame PF. As a consequence, at the time of loading the reticle R to and from the reticle-gas replacement chamber 100, mechanical interference between the reticle R and the supply nozzles 101 and the exhaust nozzles 102 can easily be avoided. In addition, the supply nozzles and exhaust nozzles are reliably connected to the supply holes and exhaust holes, making the gas replacement operation stable.

In the embodiments described above, two supply nozzles and two exhaust nozzles were provided in the reticle-has replacement chamber, but there is no restriction on this, and any number of supply nozzles and exhaust nozzles of any size may be provided. For instance, with the aim of replacing the gas in the space GS in a short period of time, a great number of supply nozzles and exhaust nozzles may be provided in the pellicle frame PF and the area of the holes which the gas flows through may be made as wide as possible.

With the aim of replacing gas more effectively, the amount of gas flow during gas replacement by the gas supply device and the gas exhaust device may be changed at predetermined periods of time, while ensuring that it does not affect the pellicle PE. The direction of the flow may also be changed. Such measures prevent buildup of local gas in the space GS.

Furthermore, when a filter is provided in order to prevent the flow of impurities through the ventilation holes h (at least one of exhaust holes h1 and h2, supply holes h3 and h4) in the pellicle frame PF of the reticle R, the gas in the space GS can be replaced by adjusting the amount of gas flow and the like.

In these embodiments, the ventilation holes h in the pellicle frame PF of the reticle R are used as supply holes and exhaust holes when replacing gas. Therefore, these embodiments have the advantage that a conventional reticle R can be used. However, the constitution is not limited to this, and opening sections for gas replacement may be newly provided in the pellicle frame PF. Consequently, a plurality of reticles R (pellicles PE and pellicle frames PF) of differing shapes can be flexibly dealt with.

Furthermore, the filter which is attached to the ventilation holes h in the pellicle frame PF may be removed at the time of replacing the gas in the space GS via the ventilation holes h in the pellicle frame PF of the reticle R. That is, attachable/removable filters are provided to the ventilation holes h of the pellicle frame PF, and the reticle-gas replacement chamber 100 is equipped with a robot arm which attaches and removes the filter to/from the pellicle frame PF. When the reticle R has been loaded to the reticle-gas replacement chamber 100, the robot arm is activated and removes the filter from the pellicle frame PF.

Moreover, a freely opening and closing door may be provided to the opening section for gas replacement. That is, the opening section is closed when normally loading the reticle R and opened when replacing the gas to allow the gas to flow in and out. This increases control responsivity of the gas replacement operation and prevents leakage of contaminant (such as light absorptive substance) to the space GS during normal loading. This should preferably be applied to a reticle wherein filters are provided to the ventilation holes h of the pellicle frame PF as described above.

Figure 5:
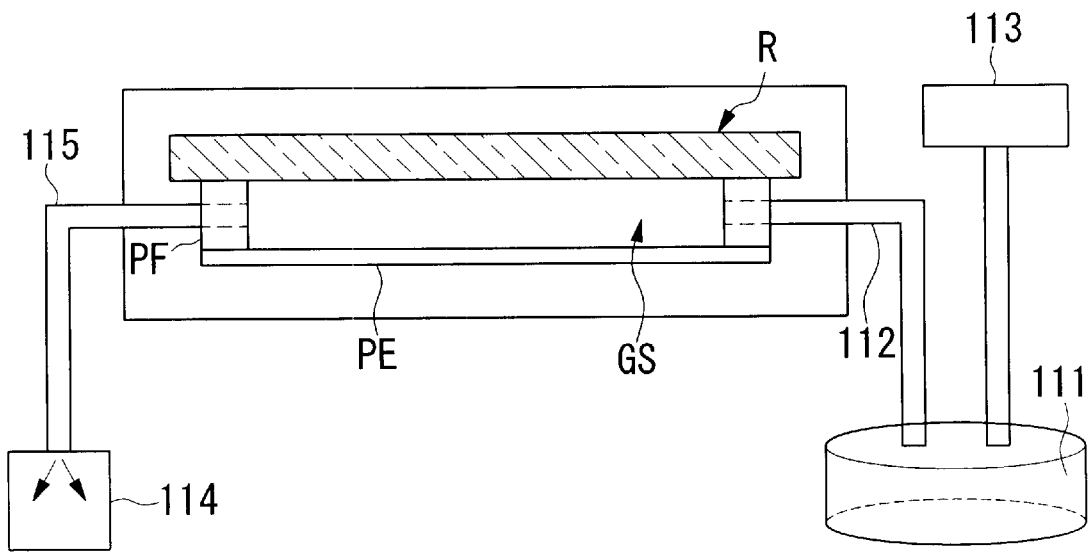
FIG. 5 is a diagram for explaining a third embodiment of the exposure apparatus according to the present invention.

Subsequently, a third embodiment of the exposure apparatus according to the present invention will be explained with reference to FIG. 5.

The third embodiment differs from the embodiments described above in respect of the point that the gas supply device 110 of the third embodiment has a reserver tank 111 which has a larger capacity than the space GS and an internal section which is maintained at a predetermined pressure.

The low absorptive gas is stored in the reserver tank 111 at approximately the same pressure as the pressure in the space GS. The reserver tank 111 connects to the space GS via a supply pipe 112. A pressure maintaining apparatus 113 is connected and supplies the low absorptive gas to the tank as appropriate so that the pressure inside the reserver tank 111 is kept at a predetermined pressure. A gas exhaust device 114 has the same constitution as that described in the preceding embodiments.

In the embodiment of this constitution, the gas exhaust device 114 exhausts the gas from the space GS, whereby an amount of low absorptive gas which is approximately the same as the amount of exhaust gas is fed from the reserver tank 111 to the space GS. Therefore, the amount of gas supplied and exhausted to/from the space GS per unit of time are approximately the same, reducing changes in pressure when the gas is fed in and out. As a consequence, it is easy to reduce deforming of the pellicle PE without complex controls.

In this case, by making the flow path cross-sectional area of the supply pipe 112 larger than that of the exhaust pipe 115, the conductance of the supply system can be made greater than that of the exhaust system. This reliably reduces pressure change in the space GS when the gas is fed in and out.

Figure 6:
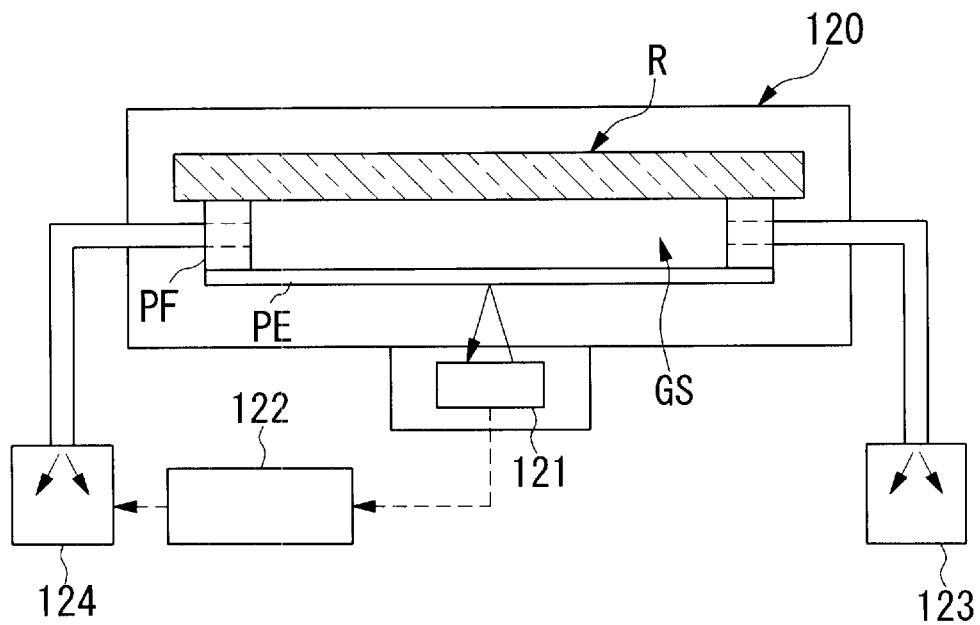
FIG. 6 is a diagram for explaining a fourth embodiment of the exposure apparatus according to the present invention.

Subsequently, a fourth embodiment of the exposure apparatus according to the present invention will be explained with reference to FIG. 6.

The fourth embodiment differs from the embodiments described above in respect of the point that the reticle-gas replacement chamber 120 is equipped with a detection device 121 which detects pressure change in the space GS. In this embodiment, a displacement sensor which detects displacement of the pellicle PE is used as the detection device 121.

The detection device 121 measures the displacement of the pellicle PE. Various types of displacement sensors, such as a laser displacement sensor, are available. For instance, when using a laser displacement sensor, projection light from the displacement sensor 121 is reflected at the pellicle PE and received by the detector. The detection result (output signal) of the displacement sensor 121 is sent to a main controller 122.

When the displacement of the pellicle PE is within a predetermined range (a range wherein there are no effects which may cause breakage, or a range wherein optical effects {e.g., changes in the refractive index due to warping of the pellicle} when the pattern on the reticle is exposed do not remain), the main controller 112 instructs at least one of the gas supply device 123 and the gas exhaust device 124 to increase the amount of gas in the supply or exhaust operation. On the other hand, when the displacement of the pellicle PE exceeds, or is about to exceed, the predetermined range, the main controller 112 issues an instruction to reduce the amount of gas.

According to the embodiment configured in this way, when replacing the gas in the space GS, the displacement of the pellicle PE is kept within a predetermined range, thereby keeping the pressure in the space GS below a fixed level. Therefore, the amount of gas in the replacement increases within a range which does not affect the pellicle PE, and the gas in the space GS is replaced in an even shorter time. Since gas replacement is performed while detecting the displacement of the pellicle PE, damage to the pellicle PE can be reliably prevented.

Depending on the displacement of the pellicle PE, the target apparatus to be controlled may be either one of the gas supply device 123 and the gas exhaust device 124. As illustrated in the third embodiment, a reserver tank may be provided as the gas supply device. Furthermore, since this embodiment uses the displacement sensor 121 as the detection device, it has an advantage that pressure change in the space GS can easily be detected from outside the pellicle PE. However, the apparatus for detecting pressure change in the space GS is not restricted to the displacement sensor 121, and another detection device such as, for example, a pressure sensor which directly detects the pressure of the space GS, may be used instead.

Figure 7:
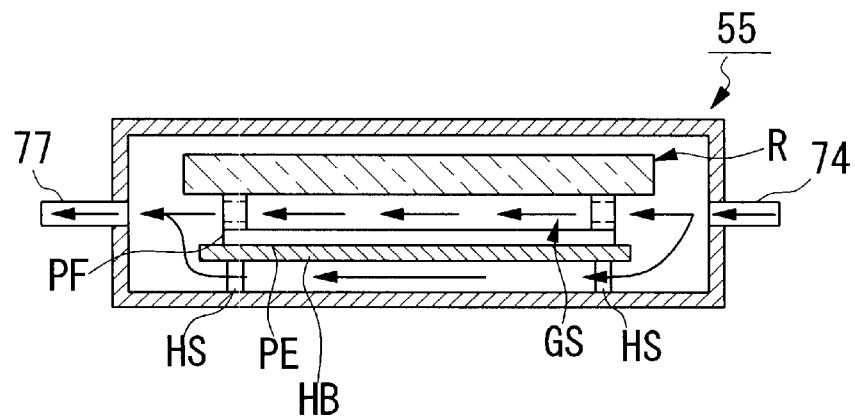
FIG. 7 is a diagram for explaining a fifth embodiment of the exposure apparatus according to the present invention.

Subsequently, a fifth embodiment of the exposure apparatus according to the present invention will be explained with reference to FIG. 7.

The fifth embodiment differs from the embodiments described above in respect of the point that the reticle-gas replacement chamber 130 of the fifth embodiment comprises a pellicle support plate HB.

The pellicle support plate HB prevents expansion of the pellicle PE. That is, when replacing the gas in the space GS with the low absorptive gas, the pressure in the space GS becomes higher than the pressure in the reticle-gas replacement chamber 130, leading to the possibility that the pellicle PE will move away from the reticle R; in other words, the pellicle PE may expand. To prevent the pellicle PE from expanding when the gas in the space GS is replaced, the pellicle support plate HB is provided in the reticle-gas replacement chamber 130 via a supporting column HS.

The pellicle support plate HB has a wider area than the total area of the pellicle PE, and comprises a pellicle contact face having substantially the same surface coarseness as the pellicle PE. The pellicle support plate HB is manufactured from metal, and a material similar to that of the pellicle may be provided on the top face of the metal. Damage to the pellicle PE can be prevented by giving due consideration to the coarseness of the pellicle contact face and material of the pellicle support plate HB in this way.

The pellicle of the reticle R, which has been loaded by the reticle loading system 56, is mounted on the pellicle contact face of the pellicle support plate HB. The pellicle contact face and all the faces of the pellicle contact each other, with the result that, even when the pressure in the space GS increases, expansion of the pellicle can be prevented.

Figure 8:
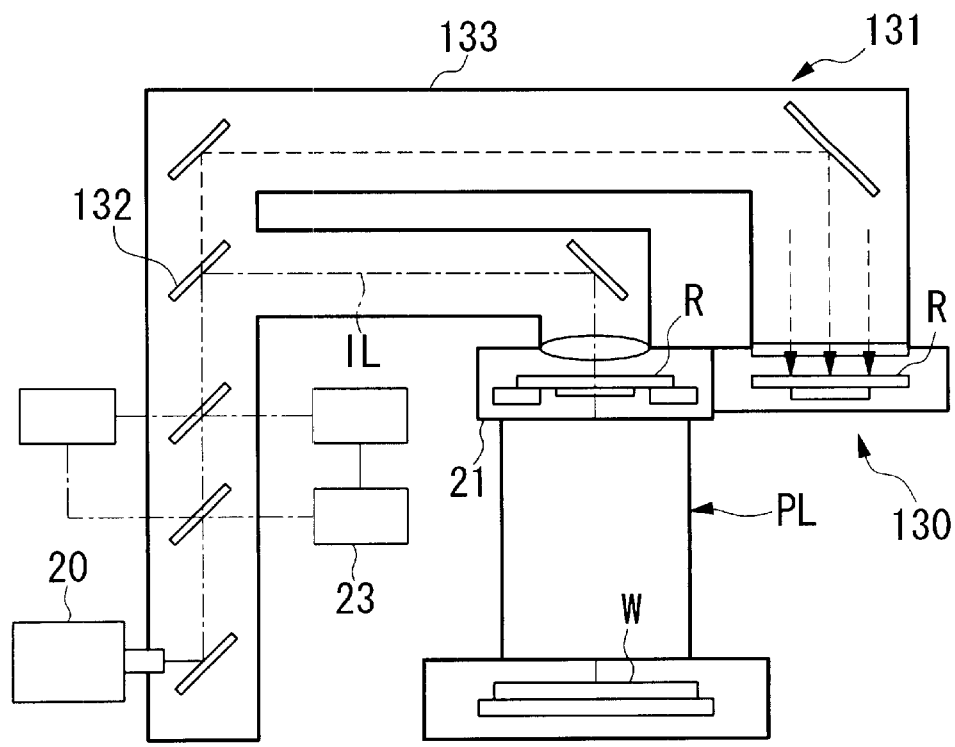
FIG. 8 is a diagram for explaining a sixth embodiment of the exposure apparatus according to the present invention.

Subsequently, a sixth embodiment of the exposure apparatus according to the present invention will be explained with reference to FIG. 8.

The sixth embodiment differs from the embodiments described above in respect of the point that the reticle-gas replacement chamber 130 of the sixth embodiment comprises an optical cleaning device 131 which cleans the reticle R and/or the pellicle PE.

The reticle-gas replacement chamber 130 of the sixth embodiment has an optical cleaning device 131 comprising the light source 20 and the illumination optical system LO, which are the same as those in the first embodiment, and an optical system 133 which leads exposure light IL, illuminated from the illumination optical system LO and split by a beam splitter, to the reticle-gas replacement chamber 130. In this embodiment, the beam of exposure light IL for transferring the pattern to the wafer W is split, and the split light is led into the reticle-gas replacement chamber 130. Ultraviolet rays having a wavelength of approximately 120 nm to 180 nm from the $F_2$ laser) used in the first embodiment are, for example, used as the illuminated light. The light source 20 comprises an unillustrated light source control device. The light source control device controls the oscillation center wavelength and spectral half band width of the radiated pulse ultraviolet rays, the trigger of the pulse oscillation, the gas in the laser chamber, and the like, in compliance with an instruction from the main controller 23.

According to the embodiment configured as described above, the reticle R is placed in the reticle-gas replacement chamber 130, and the operation of replacing the gas in the space GS is performed in tandem with the operation by the optical cleaning device 131 of leading the ultraviolet rays from the light source 20 to the reticle-gas replacement chamber 130 and radiating the light to the reticle R.

At this time, the ultraviolet light optically cleans (decomposes by oxidization) the contaminant (mainly light-absorptive substance) which has adhered to the surface of the reticle R and the pellicle PE, and materials (decomposition materials) such as water molecules and carbon dioxide molecules, which have been subsidiarily created, are released into the gas in the space GS. The water molecules and the like on the pellicle surface are heated by the ultraviolet light, making them more likely to be released from the surface and into the gas of the space GS. The decomposition material, released material, and light-absorptive substance in the gas are exhausted from the space GS during the gas replacement operation.

In other words, in this embodiment, since the contaminant (light-absorptive substance) which has adhered to the surface of the reticle R and the pellicle PE is exhausted when replacing the gas, the exposure light IL reliably passes to the reticle R provided on the optical path in the reticle chamber 21.

The light may be illuminated to the reticle R at any given time, and the optical cleaning device may optically clean surface of the reticle R and the pellicle PE by using the ultraviolet rays prior to the gas replacement operation.

Figure 9:
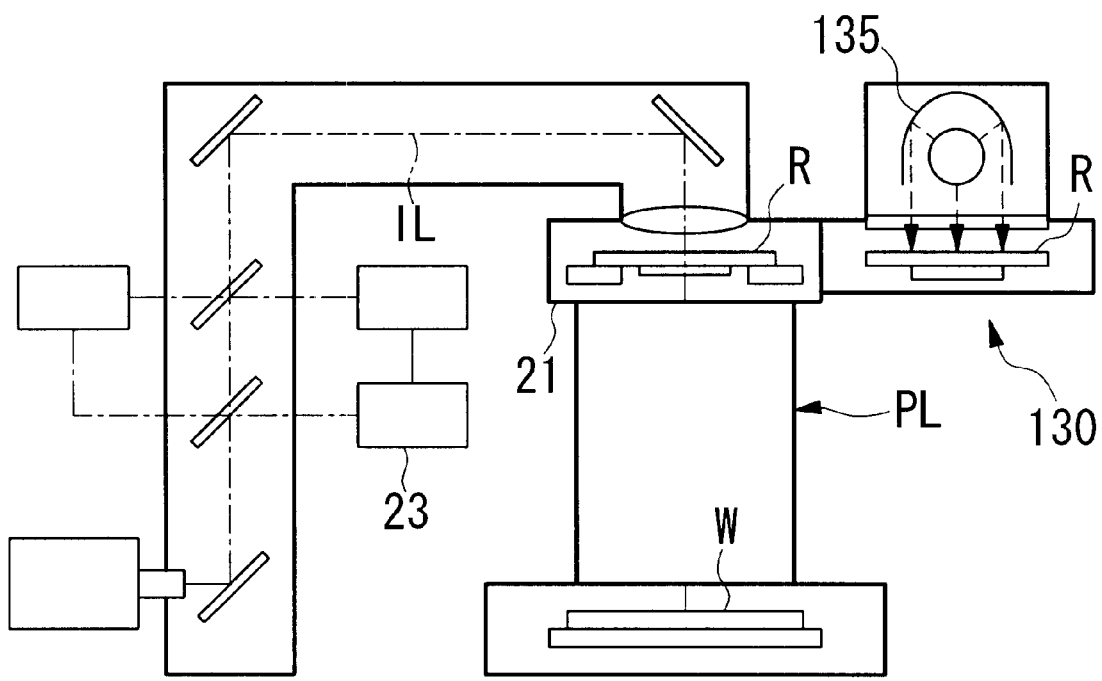
FIG. 9 is a diagram for explaining a modification of the sixth embodiment.

In this embodiment, the light which is illuminated into the reticle-gas replacement chamber 130 comprises a split beam of exposure light IL for transferring the pattern to the wafer W. Alternatively, as shown in FIG. 9, a light source 135 may be newly provided to lead light (ultraviolet rays) to the reticle-gas replacement chamber 130. In this case, light having a different wavelength to that of the exposure light for transferring the pattern can be radiated to the reticle-gas replacement chamber 130. For example, since light from the $F_2$ laser mentioned above is noticeably absorbed by oxygen molecules and the like, the pellicle PE can be reliably cleaned by using light which passes comparatively easily even when oxygen molecules are present (e.g. light having a longer wavelength than the $F_2$ laser light, such as ArF laser light and light from an excimer lamp, etc.), even in the case where there is a lot of light-absorptive substance in the space GS.

The shapes and combinations of the individual members illustrated in the embodiments described above are mere one example, and of course many types of modifications based on design requirements and the like can be made without infringing the main concepts of the invention. The present invention comprises modifications such as the following.

In each of the embodiments described above, gas in the space GS of the reticle R is replaced in the reticle-gas replacement chamber provided adjacent to the reticle chamber. However, the invention is not limited to this, and the replacement of the gas in the space GS may be performed in another place, for example in the reticle library RL and the reticle chamber 21 shown in FIG. 1.

A mask loading case (SMIF pot), which is filled with inert gas, may be used to store the reticle (mask) instead of the reticle library RL mentioned above. In this case, although it might be thought that the space of the reticle R stored in the case has been replaced with low absorptive gas, in view of the danger that the space GS may be polluted by out gas from the pellicle PE and the pellicle frame PF, it is desirable that the gas should be replaced prior to loading the reticle R into the reticle chamber 21.

In the above embodiments, the reticle loading path 50 is filled with low absorptive gas at a predetermined pressure and provided between the reticle library RL and the reticle chamber 21, but the constitution is not limited to this. A loading mechanism for loading the reticle R may be provided between the reticle library RL and the reticle chamber 21, whereby the reticle R makes direct contact with the outside atmosphere (the chamber internal space of the exposure apparatus 10). In this case, by providing the reticle-gas replacement chamber, filled with low absorptive gas, adjacent to the reticle chamber 21, the inflow of outside air should be prevented when loading the reticle R to the reticle chamber 21, and the gas in the space GS of the reticle R should be replaced in the reticle-gas replacement chamber.

The same type of low absorptive gas may be filled in all the individual spaces in the illumination optical system LO, the reticle chamber 21, the projection optical system PL and the wafer chamber 22, and in all the internal spaces of the reticle loading path 50 (containing the reticle-gas replacement chamber 55a) and the reticle library RL. Alternatively, gases of different types may be used. When using one type of gas such as nitrogen, helium, neon or argon, it is desirable that the same gas is supplied to the reticle chamber 21, the reticle loading path 50 and the reticle library RL. This is to avoid mixing gases.

Air filters and chemical filters may be provided on the supply pipes and exhaust pipes of the spaces on the optical path, feeding the gas back into the individual chambers. In this case impurities in the gas being fed back are almost completely eliminated and consequently there is almost no adverse affect on the exposure light, even when a specific gas is fed back over a long period of time.

It is acceptable to provide two reticle-gas replacement chambers, and to use one exclusively for in-loading the reticle R, and the other exclusively for unloading the reticle R. This enables the operations of loading a reticle R from the reticle chamber 21 and the operation of loading a reticle R to the reticle chamber 21 to be performed in parallel. The gas in the reticle-gas replacement chamber for unloading must be completely replaced before unloading, but a first reticle R can be unloaded to the outside from the reticle-gas replacement chamber without waiting for a second reticle R to be loaded into the reticle 21. Consequently, the time taken to exchange the reticles R can be shortened.

The above description mentioned a constitution in which the reticle loading path 50 (containing the reticle-gas replacement chamber 55a and the reticle loading chamber 55b) is filled with the low absorptive gas at a predetermined pressure and provided between the reticle library RL and the reticle chamber 21, but the reticle loading chamber 55b may be omitted.

A reticle loading mechanism for loading the reticle R is provided between the reticle library RL and the reticle chamber 21 inside the reticle-gas replacement chamber 55a. When extracting the reticle R from the reticle library RL by using this reticle loading mechanism, the door 63 of the opening 60 is closed and the opening 61 is opened. The reticle loading arm of the reticle loading mechanism is moved to the reticle library RL, and the reticle R is vacuum chucked before being loaded to the reticle-gas replacement chamber 55a.

When the reticle R is loaded into the reticle-gas replacement chamber 55a, the door 64 of the opening 61 is closed and the gas in the space GS is replaced with low absorptive gas.

When replacement ends, the opening 60 is opened and the reticle R is loaded to the reticle chamber 21.

The gas in the space GS may be replaced with low absorptive gas while the reticle R, which has been loaded to the reticle-gas replacement chamber 55a, is mounted on the reticle loading arm. Alternatively, the replacement make be performed while the reticle R is mounted on a table provided beforehand in the reticle-gas replacement chamber 55a.

When the reticle loading mechanism is provided in the reticle-gas replacement chamber 55a, there is a danger that light-absorptive substance, generated by the drive section which constitutes the loading mechanism, will seep into the reticle chamber 21 and the reticle library RL. Accordingly, the pressure in the reticle-gas replacement chamber 55a is made higher than the atmospheric pressure and lower than the pressures in the reticle chamber 21 and the reticle library RL, thereby reducing the seepage of light-absorptive substance.

Figure 11:
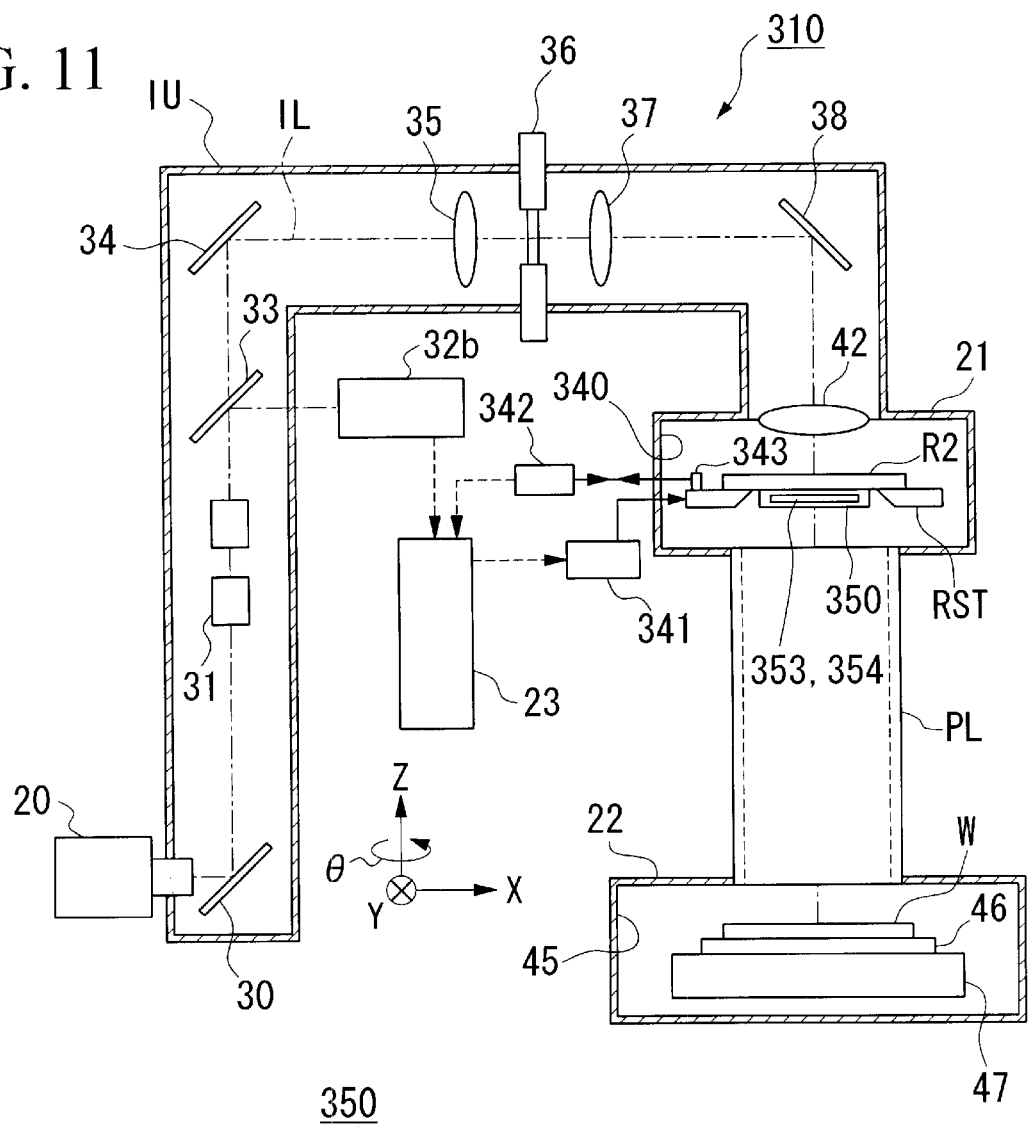
FIG. 11 is a cross-sectional view of another embodiment of the exposure apparatus according to the present invention.

FIG. 11 schematically shows the constitution of a reduction projection type exposure apparatus 310 for manufacturing a semiconductor device used in another embodiment of the present invention. Since the overall constitution of this reduction projection type exposure apparatus 310 is the same as the first embodiment, only the sections which differ from those in the first embodiment will be explained.

The reticle chamber 21 is formed by a partition 46 which is seamlessly connected to the housing of the illumination system IU and the housing of the projection optical system PL. In an internal space of the reticle chamber 21 is provided a reticle stage RST which holds a reticle R2 by vacuum chucking. The reticle stage RST is placed on an unillustrated reticle base. A stage drive system 341 moves the reticle stage RST at predetermined strokes in the Y direction (scan direction) on the reticle base, and slightly moves it in the X direction, the Y direction, and the θ direction (rotational direction). The stage drive system 341 for example comprises a linear motor for tracking (voice coil motor), a linear guide provided parallel to the Y axis for guiding the reticle stage RST in the Y direction, or the like.

The reticle stage RST is equipped with a moving mirror 343 which reflects a length-measuring beam (laser beam) from a position detection device comprising a laser interferometer 342 for measuring the respective position and amount of movement of the reticle stage RST. The laser interferometer 342 is secured to the respective reticle base by an unillustrated securing unit, and detects the position of the reticle stage RST in the X-Y face at a predetermined resolution by referring to a secure mirror, which is secured to the side face of the top end of the projection optical system PL. The position information (and speed information) of the reticle stage RST measured by the laser interferometer 342 is sent to the main controller 23. The main controller 23 controls the stage drive system 341 based on the position information (and speed information) output from the laser interferometer 342.

The reticle R2 is loaded to and from the reticle chamber 21 by an unillustrated reticle system, and exchanged as appropriate.

Figure 12:
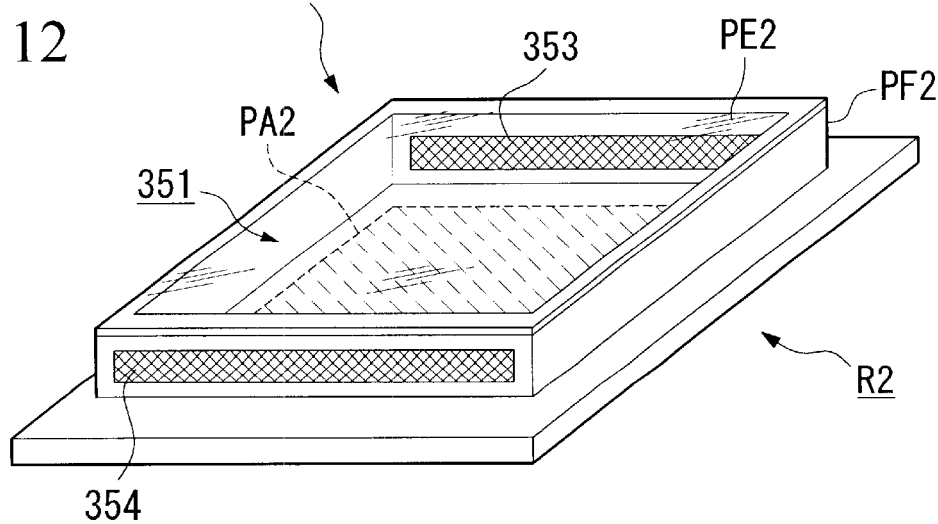
FIG. 12 is a perspective view of a reticle equipped with a protection apparatus.

FIG. 12 is a perspective view of the reticle R2 mounted on the reticle stage RST.

As shown in FIG. 12, a reticle protection apparatus 350 for protecting a pattern area PA2 is attached to the reticle R2.

The reticle protection apparatus 350 comprises a pellicle frame PF2, which surrounds the pattern area PA2, and a transparent pellicle PE2 which stretches over the pellicle frame PF2 so as to cover the pattern area PA2. The pellicle frame PF2 and the pellicle PE2 form a pellicle internal space 351 which functions as a closed space covering the pattern area of the reticle R2. In addition to a thin transparent film-like member having a thickness of approximately several hundred nanometers to several micrometers and having an organic compound such as nitrocellulose as its essential component, a quartz glass (fluorine-doped quartz or the like) having a thickness of approximately several hundred micrometers, and the like, may be used as the pellicle PE2. Instead of nitrocellulose and quartz glass, it is also acceptable to use a member comprising another nonorganic material, such as magnesium fluoride or lithium fluoride, as the pellicle PE2. The pellicle frame PF2 is a rectangular frame of metal, such as aluminum, or quartz glass, and has multiple (two in this case) openings 353 and 354 for allowing ventilation between the pellicle internal space 351 and an outside space.

In this embodiment, the openings 353 and 354 are formed in slit-like shapes in two of the four side faces of the pellicle frame PF2 which face each other in the above mentioned scan direction (Y direction) when the pellicle frame PF2 is mounted on the reticle stage RST. In this case, the open area of the slits should preferably be as large as possible without greatly reducing the strength of the pellicle frame PF2. The openings 353 and 354 should preferably be equipped with filters for preventing the passage of impurities of a predetermined size.

In this embodiment, the main controller 23 comprises a microcomputer comprised of a CPU (central processing unit), a ROM (read only memory), a RAM (random access memory) and the like. The main controller 23 monitors the reticle stage RST and the wafer stage 47 via the laser interferometer while controlling their positions as described above.

When light having a wavelength in the vacuum ultraviolet region is used for the exposure light beam as in these embodiments, material having strong absorption of the light in that waveband (hereinafter termed "light-absorptive substance") must be exhausted from the light path. Light-absorptive substance of the beam of ultraviolet light include, for instance, oxygen ($O_2$), water (water vapor $H_2O$), carbon dioxide gas (carbon dioxide $CO_2$), organic substances, halogen substances, and the like. On the other hand, in addition to nitrogen ($N_2$), rare gases such as helium (He), neon (Ne), argon (Ar), krypton (Kr), xenon (Xe), radon (Rn) are available as the gas (a material having almost no energy absorption) which the exposure light IL passes through. Hereinafter, the nitrogen and rare gases will be collectively termed "transparent gas".

In the exposure apparatus of this embodiment, an unillustrated gas supply device supplies the transparent gas having low energy absorption of a vacuum ultraviolet beam into the spaces in the optical path, that is, the individual spaces in the illumination system housing IU, the reticle chamber 21, the projection optical system PL, and the wafer chamber 22, thereby making the pressure in these spaces about the same or higher than the atmospheric pressure. In this embodiment, the pressure of the transparent gas is increased to approximately 1 to 10% higher than the atmospheric pressure. Nitrogen gas acts as a light-absorptive substance with respect to light having a wavelength of less than approximately 150 nm, and helium gas can be used as transparent gas of light having a wavelength of up to approximately 100 nm. The thermal conductivity of helium is approximately six times that of nitrogen, and the amount of fluctuation of its refractive index with respect to pressure change is approximately one-eighth that of nitrogen. For these reasons, helium has excellent characteristics of high transparency, stable image formation of an optical system, and cooling. Since helium is expensive, nitrogen may be used as the transparent gas for exposure light having a wavelength of greater than 150 nm, such as light from an $F_2$ laser, in order to reduce working costs.

Subsequently, the operation of the exposure apparatus 130 configured according to the present embodiment will be explained with special attention given to the control operation of the main controller 23.

It is assumed that the spaces on the optical path of the exposure beam IL (the individual spaces of the illumination system housing IU, the reticle chamber 21, the projection optical system PL and the wafer chamber 22) are filled beforehand with transparent gas, and set to predetermined pressure. This reduces the light-absorptive substance in the spaces and prevents infiltration of impurities from the outside.

Firstly, the main controller 23 uses an unillustrated reticle loading system to load the reticle R2 into the reticle chamber 21 and mount the reticle R2 on the reticle stage RST. The reticle loading system mounts the reticle R2 in such a manner that the plurality of openings 353 and 354 provided in the reticle protection apparatus 350 are facing in the scan direction of the reticle stage RST. The reticle R2 is mounted with the reticle protection apparatus 350 facing downward.

When the reticle R2 is mounted on the reticle stage RST, the main controller 23 scans the reticle R2 inside the reticle chamber 21. The object of this scan operation is to enable the gas in the internal space (the internal space 351 of the pellicle) of the reticle protection apparatus 350 to be replaced by the transparent gas. The scan operation is performed prior to scanning exposure, which will be explained later.

The gas replacement mechanism in this embodiment comprises the reticle stage RST, a drive system 341 which drives the reticle stage RST, and the main controller 23 which controls the stage drive system 341.

The main controller 23 drives the reticle stage RST in the Y direction by using the stage drive system 341, moving (scanning) the reticle R2 in relation to the path of the exposure beam IL. At this time, the main controller 23 controls the reticle stage RST by using the stage drive system 341 so that the reticle R2 repeatedly moves back and forth at a predetermined stroke inside the reticle chamber 21. The scanning motion of the reticle R2 causes a relative gas flow to the reticle R2.

Figure 10A:
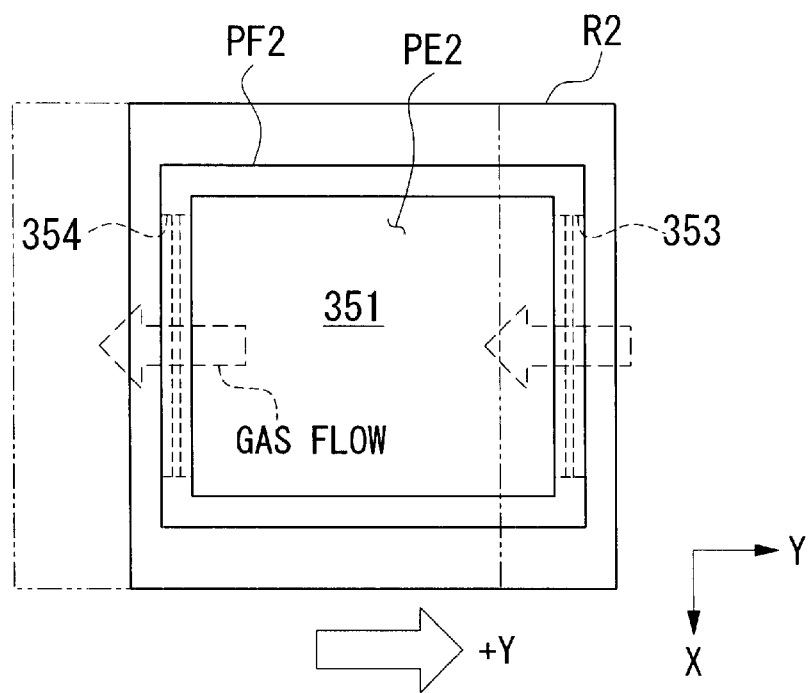
FIGS. 10A and 10B are diagrams showing another embodiment of an exposure method according to the present invention.
Figure 10B:
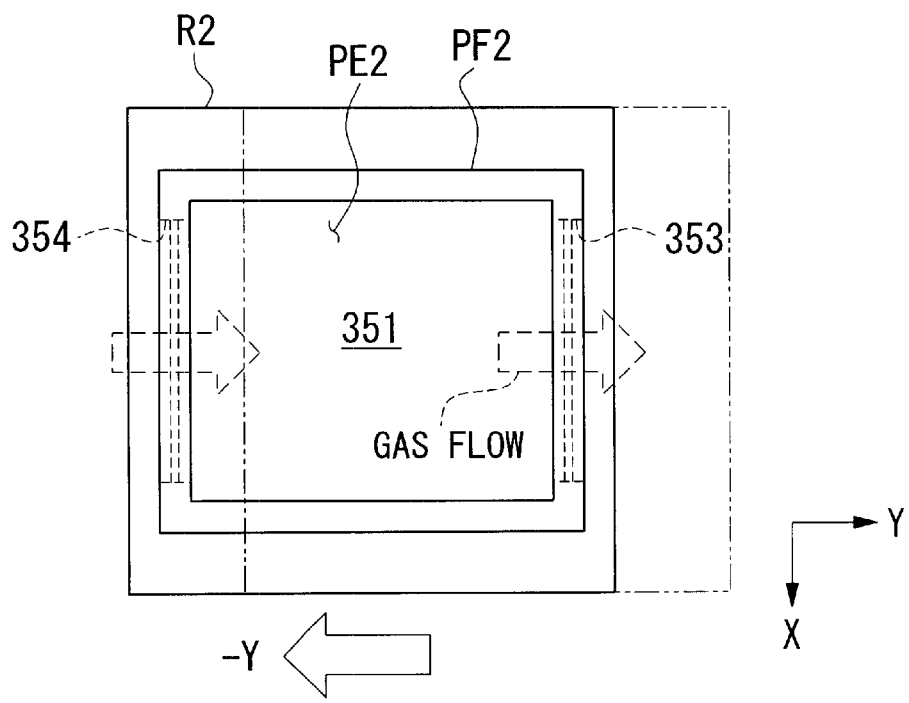

As shown for example in FIG. 10A, when the reticle R2 (reticle stage) is scan-moved in the +Y direction, the movement of the reticle R2 causes a relative gas flow in the direction (-Y direction) which is opposite to the scan direction (+Y direction) at that time. Conversely, as shown in FIG. 10B, when the reticle R2 (reticle stage) is scan-moved in the -Y direction, the movement of the reticle R2 causes a relative gas flow in the direction (+Y direction) which is opposite to the scan direction (-Y direction) at that time. As described above, slit-like openings 353 and 354 are provided in the scan direction in both side faces of the pellicle frame PF2 in the reticle protection apparatus 350 attached to the reticle R2. The relative gas flow caused by the movement of the reticle R2 leads the transparent gas from the reticle chamber into the internal space 351 of the pellicle. That is, the transparent gas from the reticle chamber flows through one of the openings 353 and 354 into the pellicle internal space 351, while the gas in the pellicle internal space 351 flows out through the other opening. This inward and outward flow of gas is repeated, replacing the gas in the pellicle internal space 351 with the transparent gas (scan replacement).

Incidentally, the operations of supplying the transparent gas to the reticle chamber 21 and exhausting the gas from the reticle chamber 21 continue during the scan replacement.

It is possible to determine whether the gas in the pellicle internal space 351 has been replaced by the transparent gas based on detected information which relates to the density of the light-absorptive substance in the pellicle internal space 351. The density of the light-absorptive substance in the pellicle internal space 351 may for example be detected by providing a gas density meter (e.g., a nitrogen density meter, a dew-point meter, or the like) midway along the exhaust pipe on the exhaust pipe from the reticle chamber 211, or by detecting the density of the transparent gas and using this as an indicator for the density of the light-absorptive substance in the pellicle internal space 351. An alternative method comprises detecting the transmittancy of the beam in the pellicle internal space 351, and using this as an indicator for the density of the light-absorptive substance in the pellicle internal space 351. To detect the transmittancy of the beam in the pellicle internal space 351, a light-amount monitor is for example provided in the wafer stage side, and the transmittancy is calculated based on the detection result of the light-amount monitor. In this embodiment, the main controller 23 determines that the transparent gas has been replaced to the pellicle internal space 351 by confirming that the number of repetitions of the scan replacement operation has reached a target number, determined from earlier tests, at which the density of light-absorptive substance in the pellicle internal space 351 is sufficiently reduced.

When the gas in the pellicle internal space 351 has been replaced by the transparent gas, the main controller 23 starts the subsequent exposure operation (scanning exposure).

The exposure apparatus 310 of this embodiment uses a step-and-scan method, in which the main controller 23 drives the reticle stage RST and relatively moves (scans) the reticle R2 with respect to the optical path of the exposure beam. In synchronism therewith, the main controller 23 moves the wafer stage 47 on the wafer side and projects an image of the pattern of the reticle R2 onto one of the plurality of shot areas provided on the wafer W. At this time, in synchronism with scanning the reticle stage RST in the scan direction (Y direction) at a speed Vs, the wafer stage 47 is scanned in the opposite direction to that of the reticle stage RST at a speed Vw (=☐·Vs, where ☐ is a projection magnification of, for example, ¼ or ⅕). In other words, the reticle stage RST is moved at a speed which is several times that of the wafer stage 47. By radiating the exposure beam IL from the light source 20 to the synchronously moving reticle R2 and wafer W, an image of the pattern formed on the reticle R2 is transferred (scanning exposure) to a shot area on the wafer W via the projection optical system PL. The abovementioned scanning exposure operation and the operation of step-moving the wafer stage 47 are repeated, sequentially transferring the image of the pattern on the reticle R2 to all the individual shot areas on the wafer W.

During scanning exposure, the reticle R2 moves in the same direction as during the scan replacement described above. Therefore, during scanning exposure, the scan-movement of the reticle R2 feeds the transparent gas in the reticle chamber 21 via the openings 353 and 354 in the pellicle frame PF2 to the pellicle internal space 351. This reduces the light-absorptive substance in the pellicle internal space 351, and maintains this reduced state of the light-absorptive substance during scanning exposure.

When exposure to all the shot areas has ended, the main controller 23 exchanges the wafer W in the wafer chamber 22 with the next wafer by using an unillustrated wafer loading system. In this embodiment, at the time of exchanging the wafer W, the reticle R2 is repeatedly moved back and forth in the scan direction to feed the transparent gas to the pellicle internal space 351. Thereafter, the exposure apparatus 310 repeatedly performs the scanning exposure operation and the wafer W exchange operation.

In this embodiment, after the reticle R2 has been accommodated in the reticle chamber 211, the reticle R2 is continuously scan-moved inside the reticle chamber 21. Consequently, the transparent gas which fills the reticle chamber 21 flows constantly into the pellicle internal space 351, replacing the gas therein, whereby a stable state of reduced light-absorptive substance in the pellicle internal space 351 is maintained. Therefore, the beam having sufficient luminance reaches the wafer W without any great absorption of the energy of the exposure beam IL from the light source 20 in the pellicle internal space 351, increasing the precision of the exposure. Moreover, to replace the gas in the pellicle internal space 351, it is necessary only to scan-move the reticle R2 in the reticle chamber 21. Therefore, gas replacement can be performed easily without newly adding a complex mechanism. The gas can be replaced even more speedily by increasing the temperature of the gas (to a temperature higher than the supplied gas) in the pellicle internal space 351, forming the first space, and the reticle chamber 21, forming the second space, in view of the fact that gas has an average molecule speed.

There is a possibility that the pellicle PE2 and the pellicle frame PF2, which form the reticle protection apparatus 350, may generate light-absorptive substance. That is, light-absorptive substance such as water molecules, which had been adhering to the pellicle PE2 and the pellicle frame PF2, is gradually released as time elapses. The light-absorptive substance is induced by the energy beam of the exposure light IL and generated as release gas constituting light-absorptive substance from the pellicle PE2. The light-absorptive substance, generated from the pellicle PE2 and the pellicle frame PF2, accumulates in the pellicle internal space 351, leading to a danger that the density of light-absorptive substance in the pellicle internal space 351 may gradually increase. As described above, this embodiment scan-moves the reticle R2 continually so that the transparent gas is constantly replaced to the pellicle internal space 351. Therefore, even when the light-absorptive substance is generated, it is exhausted from the pellicle internal space 351 as the gas is replaced, making it possible to prevent any increase in the density of light-absorptive substance in the pellicle internal space 351.

Figure 13:
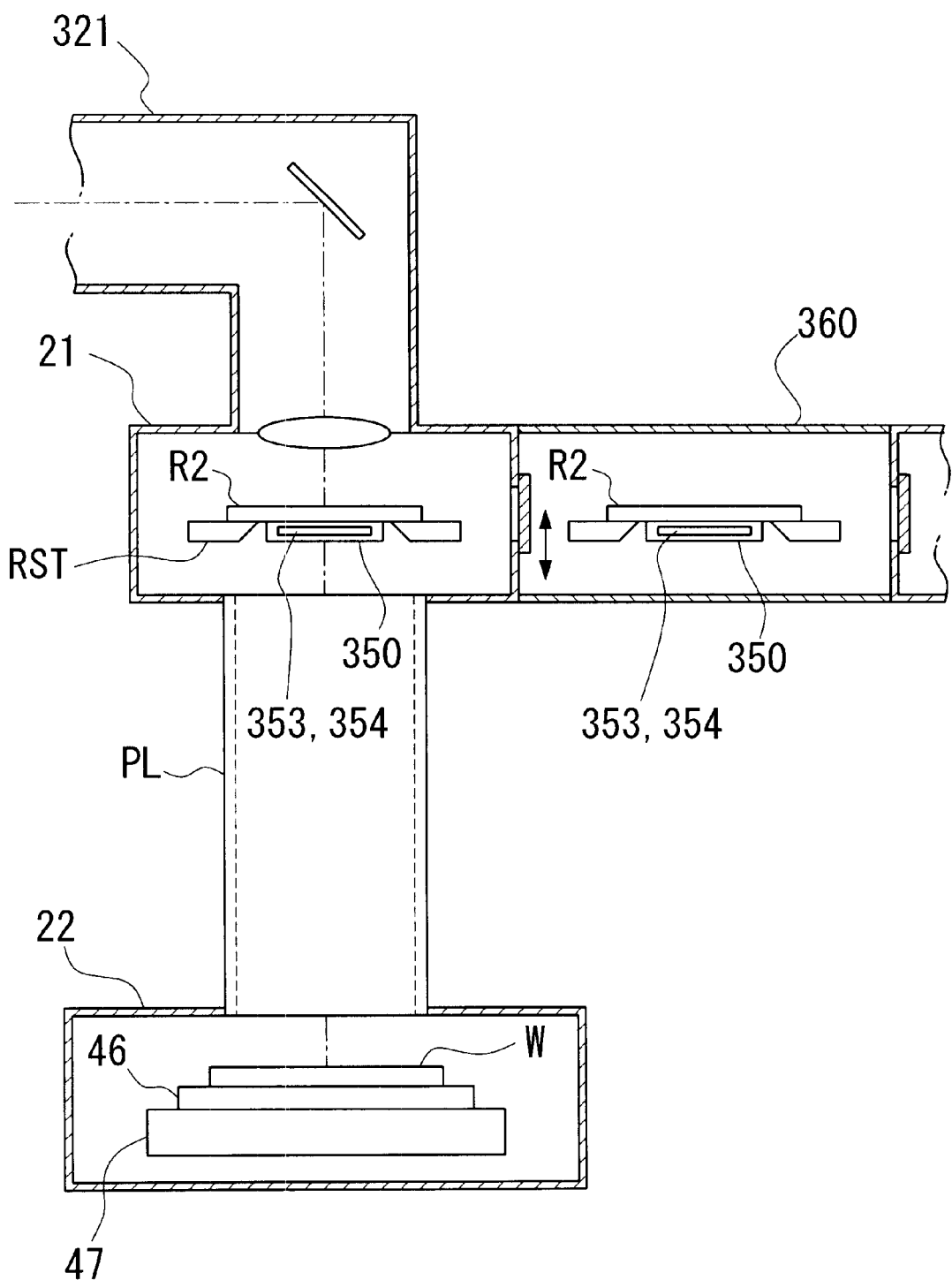
FIG. 13 is a diagram showing an example of the constitution of the exposure apparatus comprising a preliminary chamber.

In the embodiment described above, the reticle R2 is scan-moved in the reticle chamber 21 in order to reduce the light-absorptive substance in the pellicle internal space 351. As an alternative, the reticle R2 is scan-moved in order to reduce the light-absorptive substance in a space which is separate from the reticle chamber 21. For instance, as shown in FIG. 13, the reticle R2 may be scan-moved in a preparation chamber 360 which is provided adjacent to the reticle chamber 21. In this case, the reticle R2 to be loaded to the reticle chamber 21 is temporarily accommodated in the preparation chamber 360, filled with transparent gas. The reticle R2 is scan-moved in the preparation chamber 360, replacing the gas in the pellicle internal space 351 with the transparent gas. Consequently, it is possible to reduce the time required to replace the gas after the reticle R2 has been loaded to the reticle chamber 21. Another reticle R2, which is separate to the reticle R2 accommodated in the reticle chamber 21, is scan-moved in the preparation chamber 360, reducing the light-absorptive substance in the pellicle internal space 351. Therefore, it is possible to speedily perform the reticle exchange operation and proceed immediately to the exposure operation. When the preparation chamber 360 is provided, the reticle R2, which is temporarily accommodated in the reticle chamber 21, may then be loaded to the preparation chamber 360, and the light-absorptive substance in the pellicle internal space 351 is reduced inside the preparation chamber 360. Thereafter, the reticle R2 may be returned to the reticle chamber 21.

Incidentally, the replacement of gas in the pellicle internal space 351, performed in the preparation chamber 360, is not limited to scan-moving, and may be performed by using the method of the reticle-gas replacement device 55a of the first embodiment.

A cleaning method termed optical cleaning, which uses a beam having a predetermined wavelength, is known to be effective in reducing contaminant such as the abovementioned light-absorptive substance. When a beam of ultraviolet rays having a wavelength of approximately 120 nm to 180 nm, such as $F_2$ laser light, is radiated to the reticle R2, the contaminant (mainly light-absorptive substance) which has adhered to the surface of the reticle R2 and the reticle protection apparatus 350, and materials (decomposition materials) such as water molecules and carbon dioxide molecules, which have been subsidiarily created, are optically cleaned (decomposed by oxidization) and released into the gas inside and outside the pellicle internal space 351. Water molecules and the like, adhering to the surfaces of the pellicle PE2 and the pellicle frame PF2, are excited by the beam of ultraviolet light, making them more likely to be released from the surface and into the gas. Therefore, by optically cleaning the reticle R2 which is accommodated in the preparation chamber 360, materials which are likely to cause pollution can be eliminated (cleaned) in advance from the reticle R2 and the reticle protection apparatus 350, making it possible to prevent the generation of contaminants from the reticle R2 and the reticle protection apparatus 350 inside the reticle chamber 21. When performing optical cleaning in the preparation chamber 360, the optical cleaning device should preferably comprise a light source which generates a beam having a predetermined wavelength, an illumination optical system which leads the beam from the light source into the preparation chamber, a measuring apparatus such as a light-amount monitor which measures the amount of light in the illumination beam, and the like. Moreover, optical cleaning is not limited to the preparation chamber 360 and may also be performed in the reticle chamber 21. During the exposure operation, the exposure beam IL from the light source 20 illuminates the reticle R2, thereby bringing it to a state which is practically the same as optical cleaning. In addition, it is acceptable to illuminate the reticle R2 with the exposure beam IL for example when the wafer is being replaced.

Figure 14A:
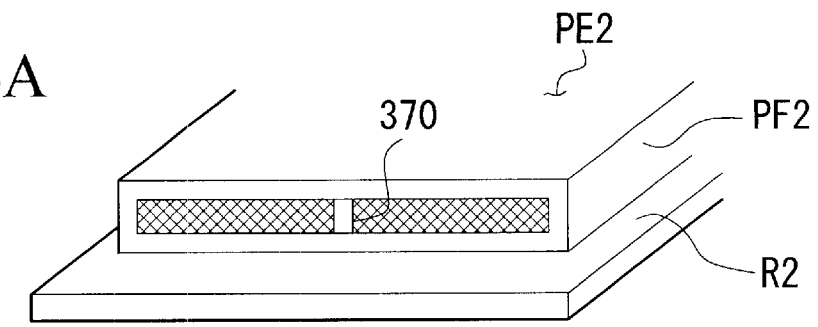
FIGS. 14A and 14B are perspective views of other examples of openings provided in the protection apparatus.
Figure 14B:
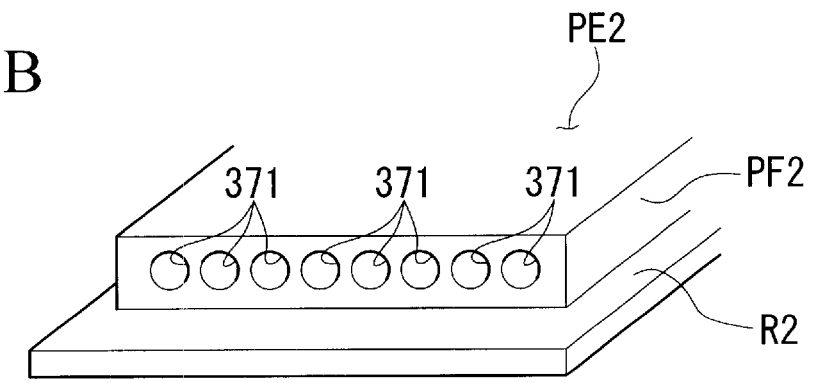

The reticle R2 shown above in FIG. 12 has slit-like openings 353 and 354 in the pellicle frame PF2 in order to lead the transparent gas into the pellicle internal space 351, but there are no limitations on the shape, number, and position of these openings. For example, as shown in FIG. 14A, a member 370 for supplementing the strength of the pellicle frame PF2 may be provided at the opening. As shown in FIG. 14B, the openings may comprise a great number of holes 371 which are formed in the side face of the pellicle frame PF2. In this embodiment, slit-like openings are provided in the frame side face in the scan direction, but further slit-like openings may be provided in the frame side face in the step direction. That is, openings may be provided in all the side faces of the pellicle frame. Filters should preferably be provided to the openings in order to prevent the infiltration of impurities to the pellicle internal space, but the constitution is not limited to this. Filters need not be provided to the openings if the space which the reticle will be accommodated in is sufficiently clean. In the case where filters are provided, they should preferably be filters which gas can pass through comparatively easily. Furthermore, a filter may be provided to the opening along the loading path of the reticle to the reticle chamber and removed from the opening when the reticle is accommodated in the reticle chamber, or after the reticle has been accommodated therein. By removing the filter in this way, there is no resistance when the gas passes through the filter, increasing the replacement efficiency of the gas. The filter may be attached and removed by using the robot arm mentioned earlier.

The operation sequence, and the shape and combinations and the like of the various constituent members described in the above embodiment are merely one example, and of course many types of modifications based on design requirements and the like can be made without infringing the main concepts of the invention. The present invention comprises modifications such as the following.

For example, in the embodiment described above, the reticle is scan-moved in a space which transparent gas is supplied to, leading the transparent gas to the pellicle internal space, but the movement direction of the reticle is not limited to this. For example, the transparent gas may be led to the pellicle internal space by rotating the reticle.

A mechanism for boosting the flow of the transparent gas to the pellicle internal space may be provided in the space which the transparent gas is supplied to. For example, the supply and exhaust openings for the transparent gas may be provided nearer to the opening in the pellicle frame, and a duct may be provided so that the transparent gas is collected toward to the pellicle frame.

By using a material such as stainless (SUS), which has surface coarseness reduced by polishing and the like, as the partition of the reticle chamber, the partition of the wafer chamber, the housing of the illumination system, the housing (lens-barrel) of the projection optical system, the partition of the reticle loading path (comprising the reticle-gas replacement chamber 55a and the preparation chamber 360), the transparent gas supply pipe, and the like, it is possible to prevent the generation of released gas.

The exposure apparatus which the present invention is applied in is not limited to a scanning exposure method (e.g. step-and-scan and the like) in which a mask (reticle) and a substrate (wafer) move relative to an illumination beam for exposure. It can also be applied in a stationary exposure method for transferring the pattern of the mask onto the substrate when the mask and substrate are in a substantially stationary state, such as a step-and-repeat method. Further, the present invention can be applied in an exposure apparatus which uses a step-and-stitch method, wherein the pattern is transferred to a plurality of overlapping shot areas on the substrate, and the like. The projection optical system may comprise a reduction system, but may be either an equal magnification or a magnifying system, a refracting system, a reflection/refraction system, or a reflecting system. Further, the present invention can be applied in an exposure apparatus of a proximity method or the like which does not use a projection optical system.

The exposure apparatus is not limited to one for manufacturing a semiconductor, and can be applied in a wide range of exposure apparatuses for manufacturing a liquid crystal display device, a thin-film magnetic head, an image-capturing device (CCD), micro-devices (electronic devices) such as a micro-machine, or a reticle and the like.

Available as the light source 20 are bright rays generated from a mercury lamp (g line (436 nm), h line (404.7 nm), i line (365 nm), KrF excimer laser (248 nm), ArF excimer laser (193 nm) and $F_2$ laser (157 nm), as well as charge particle rays, such as X rays, an electron beam, and an ion beam. In the case of using an electron beam, for example, thermionic emission type lanthanum hexaborite ($LaB_6$) or tantalum (Ta) are used as an electron gun. Further, harmonic waves produced by a YAG laser, a semiconductor laser or the like may also be used as the exposure light source.

With regard to the projection optical system, when extreme ultraviolet radiation, such as those from an excimer laser beam, are used, a material which transmits extreme ultraviolet radiation, such as a quartz or fluorite, should be used as a glass material, and when an $F_2$ laser or X rays are used, reflection/refraction optical system or a refraction optical system (a reflection type reticle should be used in this case) should be used. In the case of using an electron beam, the optical system that should be used is an electron optics system comprised of an electronic lens and a deflector. The optical path where the electron beam passes should be vacuumed.

When a linear motor is used for the wafer stage or the reticle holder, either an air float type using an air bearing or a magnetic float type using Lorentz force or reactance force may be used.

The wafer stage and reticle holder may be designed to move along guides, or may be of a guideless type that requires no guides.

When a plane motor is used as the stage driving unit, one of a magnetic unit (permanent magnet) and an armature unit should be connected to the stage while the other one should be provided on the moving surface side (base) of the stage.

The reactive force that is generated by the movement of the wafer stage may be mechanically allowed to escape into the floor (ground) by using a frame member as described in Japanese Patent Application, First Publication No. Hei 08-166475. This invention may be adapted to an exposure apparatus which has such a structure.

The reactive force that is generated by the movement of the reticle stage may be mechanically permitted to escape into the floor (ground) by using a frame member as described in Japanese Patent Application, First Publication No. Hei 08-330224. This invention may also be adapted to an exposure apparatus which has such a structure.

As described above, the exposure apparatus of this embodiment is constructed by assembling various sub-systems including the individual constituting elements as recited in the appended claims while keeping a predetermined mechanical precision, electrical precision and optical precision. To guarantee those precisions, various optical systems are adjusted to achieve the optical precision, various mechanical systems are adjusted to achieve the mechanical precision and various electric systems are adjusted to achieve the electrical precision before and after the assembly. The process of assembling various sub-systems into the exposure apparatus includes mechanical connection of various sub-systems, interconnection of electric circuits and connecting pipes to a pressure circuit. The process of assembling each sub-system comes before the process of assembling various sub-systems into the exposure apparatus. When assembling various sub-systems into the exposure apparatus is completed, general adjustment is carried out to guarantee various precisions of the exposure apparatus as a whole. It is desirable to manufacture the exposure apparatus in a clean room where the temperature and the degree of cleanness are controlled.

Figure 15:
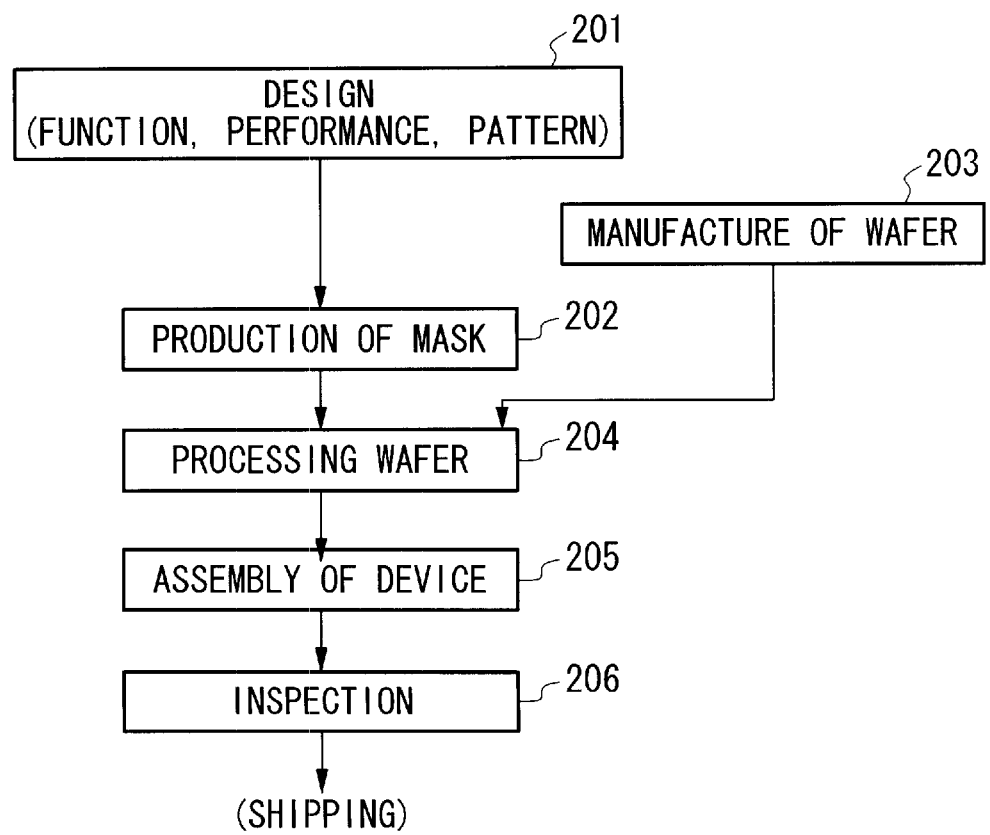
FIG. 15 is a flowchart showing an example of a device manufacturing process.

FIG. 15 shows a flowchart of manufacturing a device (semiconductor device, liquid crystal display, image-capturing device (such as a CCD), a thin-film magnetic head or the like). As shown in FIG. 15, the device is fabricated through step 201 of designing the functions and performance of the device, step 202 of producing masks (reticles) based on this design step, step 203 of producing a wafer of a silicon material, wafer processing step 204 of exposing the pattern of a reticle on the wafer using the exposure apparatus of the above-described embodiment, device assembling step 205 (including a dicing step, bonding step and packaging step), and inspection step 206.

What is claimed is:

1. An exposure apparatus comprising:
   a unit having an internal section closed to the outside;
   a gas supply device which is connected to said unit and supplies a predetermined gas through which an exposure light can pass into said unit;
   a holding member which is disposed in said unit and holds a mask having a space formed by a mask substrate, a protection member which protects a pattern formation area on the mask substrate, and a frame which supports said protection member;
   a moving mechanism which is connected to said holding member and moves said mask in a predetermined direction; and
   a control device which is connected to said moving mechanism and controls the movement of said holding member to allow said predetermined gas inside said unit to flow into said space via an opening formed in said frame,
   wherein at least one opening is formed on each of two surfaces that face each other in said frame; and
   said control device moves said holding member in a direction in which each of said at least one opening faces each other, as said predetermined direction.

2. An exposure apparatus according to claim 1, wherein said frame has a supply opening which supplies said predetermined gas in said unit to said space, and an exhaust opening which exhaust gas in said space into said unit.

3. An exposure apparatus according to claim 2, further comprising an exhaust device which is connected to said unit and exhausts said gas exhausted from said space to said unit.

4. An exposure apparatus according to claim 1, further comprising:
   an illumination optical system which is provided on an optical path of exposure light and illuminates said mask with said exposure light; and
   a projection optical system which is provided on the optical path of said exposure light and transfers an image of a pattern formed on said mask to a substrate;
   wherein said unit is provided between said illumination optical system and said projection optical system.

5. An exposure apparatus according to claim 4, wherein said moving mechanism synchronously moves said holding member and a substrate holding member which holds said substrate, and said predetermined direction is a direction of the synchronous movement of said mask and said substrate.

6. An exposure apparatus according to claim 1, further comprising:
   an illumination optical system which is provided on an optical path of exposure light and illuminates said mask with said exposure light;
   a projection optical system which is provided on the optical path of said exposure light and transfers an image of a pattern formed on said mask to a substrate; and
   a second unit which is provided between said illumination optical system and said projection optical system, and separates an internal space between said illumination optical system and said projection optical system from the outside,
   wherein said unit is connected to said second unit.

7. An exposure apparatus according to claim 3, further comprising:
   a determination device which is connected to said exhaust device and determines whether or not said space has been replaced with said predetermined gas based on the detection result of detecting a density of a light-absorptive substance in said gas exhausted from said unit.

8. An exposure apparatus according to claim 1, wherein an optical cleaning device which optically cleans at least one of said mask and said protection member is provided in said unit.

9. An exposure apparatus according to claims 1, further comprising:
   an impurity elimination filter which is removably installed in said opening.

10. An exposure method comprising:
    accommodating, in a unit, a mask having a space formed by a mask substrate, a protection member which protects a pattern formation area on said mask substrate, and a frame which supports said protection member;
    supplying a predetermined gas, through which exposure light can pass, into said unit; and
    moving said mask in a predetermined direction in said unit in order to allow said predetermined gas to flow into said space via an opening formed in said frame, wherein at least one opening is formed on each of two surfaces that face each other in said frame; and
    said predetermined direction is a direction in which each of said at least one opening faces each other.

11. An exposure method according to claim 10, wherein said unit is provided between an illumination optical system which illuminates said mask using exposure light and a projection optical system which transfers an image of a pattern formed on said mask to a substrate; and
    said predetermined direction is a direction of the synchronous movement of said mask and said substrate.

12. An exposure method according to claim 11, wherein, prior to synchronously moving said mask and said substrate, said mask is moved in said predetermined direction and the gas in said space is replaced with said predetermined gas.

13. An exposure method according to claim 10, wherein said unit forms a mask chamber in which said mask is accommodated at the time of transferring the pattern of said mask to said substrate; and
    at the time of exchanging said substrate with another substrate, said mask is moved in said predetermined direction and said predetermined gas is fed to said space.

14. An exposure method according to claim 11, wherein said unit forms a mask chamber in which said mask is accommodated at the time of transferring the pattern of said mask to said substrate; and, while synchronously moving said mask and said substrate, the gas in said space is replaced with said predetermined gas.

15. An exposure method according to claim 11, wherein said mask is moved in said predetermined direction in a separate unit separated from said unit which forms said mask chamber, and said predetermined gas is fed to said space.

16. An exposure method according to claim 10, wherein information relating to the density of impurities in said unit is detected, and said mask is moved based on the detection result.

17. A device manufacturing method using a photolithography process, said photolithography process manufacturing a device by said exposure method according to claim 10.

18. An exposure method according to claim 10, wherein at least one of said mask and said protection member is optically cleaned.

* * * * *